US008647993B2

(12) United States Patent
LaVoie et al.

(10) Patent No.: US 8,647,993 B2
(45) Date of Patent: Feb. 11, 2014

(54) METHODS FOR UV-ASSISTED CONFORMAL FILM DEPOSITION

(75) Inventors: Adrien LaVoie, Portland, OR (US); Bhadri Varadarajan, Beaverton, OR (US); Jon Henri, West Linn, OR (US); Dennis Hausmann, Lake Oswego, OR (US)

(73) Assignee: Novellus Systems, Inc., Fremont, CA (US)

( * ) Notice: Subject to any disclaimer, the term of this patent is extended or adjusted under 35 U.S.C. 154(b) by 0 days.

(21) Appl. No.: 13/472,282

(22) Filed: May 15, 2012

(65) Prior Publication Data

US 2013/0196516 A1 Aug. 1, 2013

Related U.S. Application Data

(63) Continuation-in-part of application No. 13/084,305, filed on Apr. 11, 2011.

(60) Provisional application No. 61/591,230, filed on Jan. 26, 2012.

(51) Int. Cl.
*H01L 21/469* (2006.01)
*H01L 21/31* (2006.01)

(52) U.S. Cl.
USPC ........... 438/776; 438/778; 438/791; 438/788; 438/787

(58) Field of Classification Search
USPC .................... 438/776, 778, 791, 788, 787
See application file for complete search history.

(56) References Cited

U.S. PATENT DOCUMENTS

| 5,496,608 | A | 3/1996 | Matsuda et al. |
| 5,670,432 | A | 9/1997 | Tsai |
| 5,856,003 | A | 1/1999 | Chiu |
| 5,874,368 | A | 2/1999 | Laxman et al. |
| 5,932,286 | A | 8/1999 | Beinglass et al. |
| 6,270,572 | B1 | 8/2001 | Kim et al. |
| 6,391,803 | B1 | 5/2002 | Kim et al. |
| 6,428,859 | B1 | 8/2002 | Chiang et al. |

(Continued)

FOREIGN PATENT DOCUMENTS

| EP | 2 278 046 | 1/2011 |
| JP | 4364320 | 8/2009 |

(Continued)

OTHER PUBLICATIONS

U.S. Appl. No. 13/084,399, filed Apr. 11, 2011, entitled "Plasma Activated Conformal Film Deposition." [see U.S. Patent Publication No. 2011-0256726].

(Continued)

*Primary Examiner* — Luan C Thai
(74) *Attorney, Agent, or Firm* — Weaver Austin Villeneuve & Sampson LLP

(57) ABSTRACT

Described are methods of making silicon nitride (SiN) materials and other silicon-containing films, including carbon-containing and/or oxygen-containing films such as SiCN (also referred to as SiNC), SiON and SiONC films, on substrates. According to various embodiments, the methods involve electromagnetic radiation-assisted activation of one or more reactants. In certain embodiments, for example, the methods involve ultraviolet (UV) activation of vapor phase amine coreactants. The methods can be used to deposit silicon-containing films, including SiN and SiCN films, at temperatures below about 400° C.

18 Claims, 15 Drawing Sheets

(56) References Cited

U.S. PATENT DOCUMENTS

| | | |
|---|---|---|
| 6,468,924 B2 | 10/2002 | Lee et al. |
| 6,528,430 B2 | 3/2003 | Kwan et al. |
| 6,551,893 B1 | 4/2003 | Zheng et al. |
| 6,576,053 B1 | 6/2003 | Kim et al. |
| 6,632,478 B2 | 10/2003 | Gaillard et al. |
| 6,645,574 B1 | 11/2003 | Lee et al. |
| 6,723,595 B2 | 4/2004 | Park |
| 6,730,614 B1 | 5/2004 | Lim et al. |
| 6,743,738 B2 | 6/2004 | Todd |
| 6,809,421 B1 | 10/2004 | Hayasaka et al. |
| 6,828,218 B2 | 12/2004 | Kim et al. |
| 6,835,417 B2 | 12/2004 | Saenger et al. |
| 6,861,356 B2 | 3/2005 | Matsuse et al. |
| 6,930,060 B2 | 8/2005 | Chou et al. |
| 6,943,092 B2 | 9/2005 | Kim et al. |
| 6,962,876 B2 | 11/2005 | Ahn et al. |
| 6,987,240 B2 | 1/2006 | Jennings et al. |
| 7,001,844 B2 | 2/2006 | Chakravarti et al. |
| 7,041,335 B2 | 5/2006 | Chung |
| 7,077,904 B2 | 7/2006 | Cho et al. |
| 7,081,271 B2 | 7/2006 | Chung et al. |
| 7,109,129 B1 | 9/2006 | Papasouliotis |
| 7,115,528 B2 | 10/2006 | Vaartstra et al. |
| 7,122,222 B2 | 10/2006 | Xiao et al. |
| 7,122,464 B2 | 10/2006 | Vaartstra |
| 7,132,353 B1 | 11/2006 | Xia et al. |
| 7,148,155 B1 | 12/2006 | Tarafdar et al. |
| 7,151,039 B2 | 12/2006 | Lee et al. |
| 7,172,792 B2 | 2/2007 | Wang et al. |
| 7,176,084 B2 | 2/2007 | Lee et al. |
| 7,205,187 B2 | 4/2007 | Leith et al. |
| 7,223,649 B2 | 5/2007 | Oh et al. |
| 7,241,686 B2 | 7/2007 | Marcadal et al. |
| 7,244,668 B2 | 7/2007 | Kim |
| 7,250,083 B2 | 7/2007 | Sneh |
| 7,259,050 B2 | 8/2007 | Chen et al. |
| 7,261,919 B2 | 8/2007 | Mehregany et al. |
| 7,294,582 B2 | 11/2007 | Haverkort et al. |
| 7,297,641 B2 | 11/2007 | Todd et al. |
| 7,300,885 B2 | 11/2007 | Hasebe et al. |
| 7,314,835 B2 | 1/2008 | Ishizaka et al. |
| 7,341,959 B2 | 3/2008 | Brcka |
| 7,351,668 B2 | 4/2008 | Chou et al. |
| 7,361,538 B2 | 4/2008 | Luan et al. |
| 7,390,743 B2 | 6/2008 | Shin |
| 7,393,561 B2 | 7/2008 | Paranjpe |
| 7,419,888 B2 | 9/2008 | Yang et al. |
| 7,435,454 B2 | 10/2008 | Brcka |
| 7,435,684 B1 | 10/2008 | Lang et al. |
| 7,462,571 B2 | 12/2008 | Hasebe et al. |
| 7,482,247 B1 | 1/2009 | Papasouliotis et al. |
| 7,488,694 B2 | 2/2009 | Kim et al. |
| 7,507,676 B2 | 3/2009 | Chou et al. |
| 7,510,984 B2 | 3/2009 | Saito et al. |
| 7,521,331 B2 | 4/2009 | Park et al. |
| 7,524,762 B2 | 4/2009 | Marcadal et al. |
| 7,544,615 B2 | 6/2009 | Vaartstra |
| 7,572,052 B2 | 8/2009 | Ravi et al. |
| 7,592,231 B2 | 9/2009 | Cheng et al. |
| 7,601,648 B2 | 10/2009 | Chua et al. |
| 7,615,449 B2 | 11/2009 | Chung et al. |
| 7,622,369 B1 | 11/2009 | Lee et al. |
| 7,622,383 B2 | 11/2009 | Kim et al. |
| 7,629,267 B2 | 12/2009 | Wan et al. |
| 7,632,757 B2 | 12/2009 | Matsuura |
| 7,633,125 B2 | 12/2009 | Lu et al. |
| 7,638,170 B2 | 12/2009 | Li |
| 7,645,484 B2 | 1/2010 | Ishizaka |
| 7,651,729 B2 | 1/2010 | Kim et al. |
| 7,651,730 B2 | 1/2010 | Hasebe |
| 7,651,953 B2 | 1/2010 | Todd et al. |
| 7,651,959 B2 | 1/2010 | Fukazawa et al. |
| 7,682,657 B2 | 3/2010 | Sherman |
| 7,713,592 B2 | 5/2010 | Nguyen et al. |
| 7,758,920 B2 | 7/2010 | Hasebe et al. |
| 7,776,733 B2 | 8/2010 | Hasegawa |
| 7,825,039 B2 | 11/2010 | Takahashi et al. |
| 7,919,416 B2 | 4/2011 | Lee et al. |
| 7,923,378 B2 | 4/2011 | Hasebe et al. |
| 7,959,985 B2 | 6/2011 | Ishizaka et al. |
| 7,964,241 B2 | 6/2011 | Hasebe et al. |
| 7,964,513 B2 | 6/2011 | Todd et al. |
| 7,989,365 B2 | 8/2011 | Park et al. |
| 8,034,673 B2 | 10/2011 | Kadonaga et al. |
| 8,080,290 B2 | 12/2011 | Hasebe et al. |
| 8,101,531 B1 | 1/2012 | Li et al. |
| 8,119,544 B2 | 2/2012 | Hasebe et al. |
| 8,178,448 B2 | 5/2012 | Nodera et al. |
| 8,227,032 B2 | 7/2012 | Dussarrat et al. |
| 8,257,789 B2 | 9/2012 | Matsunaga et al. |
| 8,366,953 B2 | 2/2013 | Kohno et al. |
| 8,394,466 B2 | 3/2013 | Hong et al. |
| 8,524,612 B2 | 9/2013 | Li et al. |
| 2004/0033698 A1 | 2/2004 | Lee et al. |
| 2005/0109276 A1 | 5/2005 | Iyer et al. |
| 2005/0118837 A1 | 6/2005 | Todd et al. |
| 2005/0159017 A1 | 7/2005 | Kim et al. |
| 2005/0196977 A1 | 9/2005 | Saito et al. |
| 2005/0233553 A1 | 10/2005 | Kountz et al. |
| 2005/0260347 A1 | 11/2005 | Narwankar et al. |
| 2005/0287775 A1 | 12/2005 | Hasebe et al. |
| 2006/0084283 A1 | 4/2006 | Paranjpe et al. |
| 2006/0088985 A1 | 4/2006 | Haverkort et al. |
| 2006/0165890 A1 | 7/2006 | Kaushal et al. |
| 2006/0199357 A1 | 9/2006 | Wan et al. |
| 2006/0286776 A1 | 12/2006 | Ranish et al. |
| 2006/0286818 A1 | 12/2006 | Wang et al. |
| 2007/0010071 A1 | 1/2007 | Matsuura |
| 2007/0137572 A1 | 6/2007 | Matsuura et al. |
| 2007/0167028 A1 | 7/2007 | Chou et al. |
| 2007/0232082 A1 | 10/2007 | Balseanu et al. |
| 2007/0251444 A1 | 11/2007 | Gros-Jean et al. |
| 2008/0038936 A1 | 2/2008 | Todd et al. |
| 2008/0063791 A1 | 3/2008 | Hasebe et al. |
| 2008/0213479 A1 | 9/2008 | Chou et al. |
| 2008/0242116 A1 | 10/2008 | Clark |
| 2008/0274302 A1 | 11/2008 | Hasebe et al. |
| 2008/0311760 A1 | 12/2008 | Nodera et al. |
| 2009/0018668 A1 | 1/2009 | Galbraith |
| 2009/0039349 A1 | 2/2009 | Honda |
| 2009/0065896 A1 | 3/2009 | Hwang et al. |
| 2009/0075490 A1* | 3/2009 | Dussarrat ............... 438/787 |
| 2009/0148625 A1 | 6/2009 | Yeom et al. |
| 2009/0155606 A1 | 6/2009 | Yoon et al. |
| 2009/0163012 A1 | 6/2009 | Clark et al. |
| 2009/0208880 A1 | 8/2009 | Nemani et al. |
| 2009/0278224 A1 | 11/2009 | Kim et al. |
| 2010/0025824 A1 | 2/2010 | Chen et al. |
| 2010/0102417 A1 | 4/2010 | Ganguli et al. |
| 2010/0124621 A1 | 5/2010 | Kobayashi et al. |
| 2010/0136260 A1 | 6/2010 | Matsunaga et al. |
| 2010/0136313 A1 | 6/2010 | Shimizu et al. |
| 2010/0221925 A1 | 9/2010 | Lee et al. |
| 2010/0304574 A1 | 12/2010 | Nodera et al. |
| 2011/0003445 A1 | 1/2011 | Murata et al. |
| 2011/0014795 A1 | 1/2011 | Lee et al. |
| 2011/0014798 A1 | 1/2011 | Mallick et al. |
| 2011/0086516 A1 | 4/2011 | Lee et al. |
| 2011/0151142 A1 | 6/2011 | Seamons et al. |
| 2011/0159202 A1 | 6/2011 | Matsushita et al. |
| 2011/0256726 A1 | 10/2011 | LaVoie et al. |
| 2011/0256734 A1* | 10/2011 | Hausmann et al. ........... 438/776 |
| 2011/0298099 A1 | 12/2011 | Lee et al. |
| 2012/0009802 A1 | 1/2012 | LaVoie et al. |
| 2012/0009803 A1 | 1/2012 | Jung et al. |
| 2012/0028454 A1 | 2/2012 | Swaminathan et al. |
| 2012/0028469 A1 | 2/2012 | Onizawa et al. |
| 2012/0058282 A1 | 3/2012 | Hong et al. |
| 2012/0077349 A1 | 3/2012 | Li et al. |
| 2012/0108079 A1 | 5/2012 | Mahajani |
| 2012/0213940 A1 | 8/2012 | Mallick |
| 2012/0282418 A1 | 11/2012 | Chou et al. |
| 2012/0315394 A1 | 12/2012 | Ito |
| 2013/0040447 A1 | 2/2013 | Swaminathan et al. |

(56) References Cited

U.S. PATENT DOCUMENTS

| | | |
|---|---|---|
| 2013/0071580 A1 | 3/2013 | Weidman et al. |
| 2013/0115783 A1 | 5/2013 | Kim et al. |
| 2013/0189854 A1 | 7/2013 | Hausmann et al. |
| 2013/0196516 A1 | 8/2013 | Lavoie et al. |

FOREIGN PATENT DOCUMENTS

| | | |
|---|---|---|
| JP | 2010-10497 | 1/2010 |
| KR | 10-2001-0111448 | 12/2001 |
| KR | 10-2004-0001036 | 1/2004 |
| KR | 10-2009-0057665 | 6/2009 |
| KR | 10-2009-0081396 | 7/2009 |
| WO | WO 2007/118026 | 10/2007 |
| WO | WO 2011/130326 | 10/2011 |
| WO | WO 2011/130397 | 10/2011 |
| WO | WO 2012/040317 | 3/2012 |
| WO | WO 2012/087737 | 6/2012 |
| WO | WO 2013/032786 | 3/2013 |
| WO | WO 2013/043330 | 3/2013 |
| WO | WO 2013/112727 | 8/2013 |

OTHER PUBLICATIONS

U.S. Appl. No. 13/084,305, filed Apr. 11, 2011, entitled "Silicon Nitride Films and Methods." [see US Patent Publication No. 2011-0256734].

U.S. Appl. No. 13/242,084, filed Sep. 23, 2011, entitled "Plasma Activated Conformal Dielectric Film Deposition."

U.S. Appl. No. 13/224,240, filed Sep. 1, 2011, entitled "Plasma Activated Conformal Dielectric Film Deposition."

U.S. Appl. No. 13/414,619, filed Mar. 7, 2012, entitled "Method for Depositing a Cholrine-Free Conformal Sin Film."

Lee, Jong Ju, Low-impurity, highly conformal atomic layer deposition of titanium nitride using $NH_3$—Ar—$H_2$ plasma treatment for capacitor electrodes, Lawrence Berkeley National Laboratory, University of California, Berkeley, CA (2004).

"PlasmaPro," Oxford Instruments (2010).

Cecchi et al., "Ultra-thin conformal pore-sealing of low-k materials by plasma-assisted ALD," University of New Mexico, Albuquerque, NM, Sandia National Labs, Albuquerque, NM (2007).

Lee et al., "Chemically conformal deposition of $SrTiO_3$ thin films by Atomic Layer Deposition using conventional metal organic precursors and remote-plasma activated $H_2O$," School of Materials Science and Engineering, and Inter-university Semiconductor Research Center, Seoul National University, Microelectronic Engineering 80 (2005).

Plasma Enhanced Atomic Layer Deposition (PEALD), Website: http://www.asm.com/index.php?option=com_content&task=view&id=19&Itemid=161 (2010).

International Search Report and Written Opinion, dated Oct. 20, 2011, issued in PCT/US2011/032186.

Invitation to Pay Additional Fees; Communication Re Partial International Search, dated Dec. 16, 2011, issued in PCT/US2011/032303.

King, Sean W., "Plasma enhanced atomic layer deposition of $SiN_x$:H and $SiO_2$," J. Vac. Sci. Technol. A 29(4), Jul./Aug. 2011.

International Search Report and Written Opinion, dated Feb. 20, 2012, issued in PCT/US2011/032303.

U.S. Appl. No. 13/963,212, filed Aug. 9, 2013, entitled "Plasma-Activated Deposition of Conformal Films".

U.S. Appl. No. 13/953,616, filed Jul. 29, 2013, entitled "High Pressure, High Power Plasma Activated Conformal Film Deposition".

US Office Action dated Mar. 15, 2013 issued in U.S. Appl. No. 13/084,399.

US Office Action dated Sep. 14, 2012 issued in U.S. Appl. No. 13/084,305.

US Final Office Action dated Apr. 25, 2013 issued in U.S. Appl. No. 13/084,305.

US Office Action dated Apr. 13, 2011 issued in U.S. Appl. No. 12/889,132.

US Notice of Allowance dated Sep. 30, 2011 issued in U.S. Appl. No. 12/889,132.

US Office Action dated Aug. 1, 2012 issued in U.S. Appl. No. 13/011,569.

US Final Office Action dated Feb. 26, 2013 issued in U.S. Appl. No. 13/011,569.

US Notice of Allowance dated May 6, 2013 issued in U.S. Appl. No. 13/011,569.

US Office Action dated Apr. 4, 2013 issued U.S. Appl. No. 13/242,084.

US Notice of Allowance dated Jun. 19, 2013 issued U.S. Appl. No. 13/242,084.

US Office Action dated Apr. 29, 2013 issued U.S. Appl. No. 13/224,240.

US Office Action dated Jun. 7, 2013 issued U.S. Appl. No. 13/414,619.

PCT International Preliminary Report on Patentability dated Oct. 26, 2012, issued in PCT/US2011/032186.

PCT International Preliminary Report on Patentability and Written Opinion, dated Oct. 26, 2012, issued in PCT/US2011/032303.

PCT International Search Report and Written Opinion dated May 2, 2012 issued in Application No. PCT/US2011/052537.

PCT International Preliminary Report on Patentability and Written Opinion dated Apr. 4, 2013 issued in Application No. PCT/US2011/052537.

PCT International Search Report and Written Opinion dated Dec. 18, 2012, issued in Application No. PCT/US2012/052769.

PCT International Search Report and Written Opinion dated Feb. 28, 2013, issued in Application No. PCT/US2012/051740.

PCT International Search Report and Written Opinion dated May 27, 2013, issued in Application No. PCT/US2013/022977.

Choi, Gyu-Jin et al., (2009) "Plasma-enhanced atomic layer deposition of TiO2 and Al-doped TiO2 films using N2O and O2 reactants," Journal of the Electrochemical Society, 156 ISS, 9 pp, G138-G143.

Man P.F. et al., "Elimination of Post-Release Adhesion in Microstructures Using Conformal Fluorocarbon Coatings," MEMS '96 Proceedings, IEEE Feb. 11-15, 1996, pp. 55-60.

Nguyen, S.V. et al., Plasma-assist chemical vapor deposition of dielectric thin films for ULSI semiconductor circuits, IBM J.Res. Develop. vol. 43, No. 1.2, Jan./Mar. 1999, pp. 5-38.

* cited by examiner

METHODS FOR UV-ASSISTED CONFORMAL FILM DEPOSITION

This application claims benefit under 35 USC §119(e) of U.S. Provisional Application No. 61/591,230, titled "METHODS FOR UV-ASSISTED CONFORMAL FILM DEPOSITION," filed Jan. 26, 2012, which is incorporated by reference herein. This application also claims priority, as a continuation-in-part under 35 USC §120, to U.S. patent application Ser. No. 13/084,305, filed Apr. 11, 2011, and titled "SILICON NITRIDE FILMS AND METHODS."

INTRODUCTION

1. Field

The present disclosure relates generally to formation of silicon-containing materials, including SiN, SiCN and SiC materials on substrates. More particularly, the disclosure relates to formation of silicon-containing films on semiconductor substrates.

2. Background

Silicon nitride (SiN) thin films have unique physical, chemical and mechanical properties and thus are used in a variety of applications, particularly semiconductor devices, for example in diffusion barriers, gate insulators, sidewall spacers, encapsulation layers, strained films in transistors, and the like. One issue with SiN films is the relatively high temperatures used to form the films, for example, in Front End of Line (FEOL) applications, SiN films are typically deposited by chemical vapor deposition (CVD) in a reactor at greater than 750° C. using dichlorosilane and ammonia. However, as SiN films are used in late-stage semiconductor fabrication processes, and as device dimensions continue to shrink, there is an increasing demand for SiN films to be formed at lower temperatures, for example less than 600° C.

SUMMARY OF THE INVENTION

Described are methods of making silicon nitride (SiN) materials and other silicon-containing films, including carbon-containing and/or oxygen-containing films such as SiCN (also referred to as SiNC), SiON and SiONC films, on substrates. According to various embodiments, the methods involve electromagnetic radiation-assisted activation of one or more reactants. In certain embodiments, for example, the methods involve ultraviolet (UV) activation of vapor phase amine coreactants. The methods can be used to deposit silicon-containing films, including SiN and SiCN films, at temperatures below about 400° C.

These and other features and advantages of the present invention will be described in more detail below with reference to the associated drawings.

DETAILED DESCRIPTION

Overview

Figure 1:
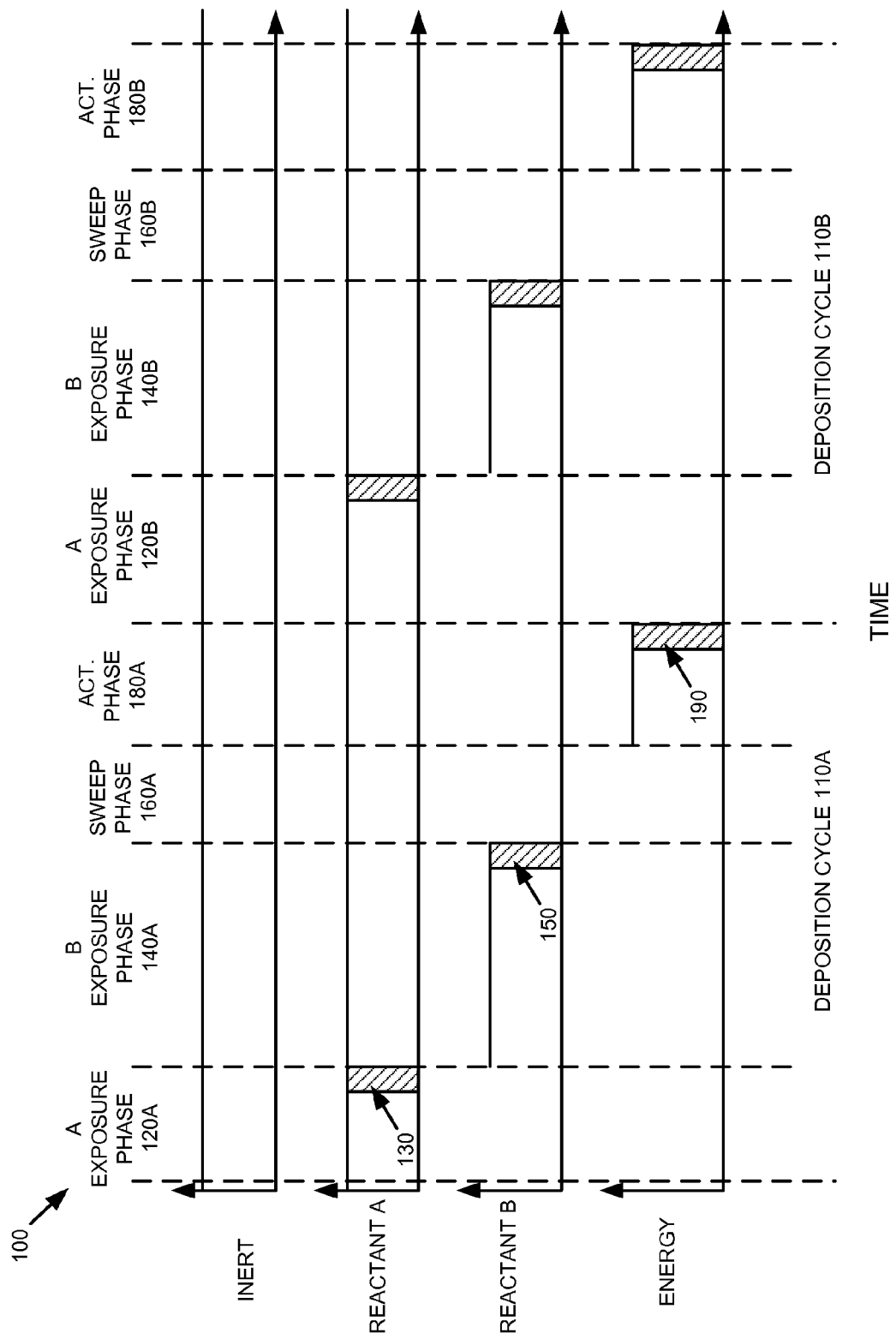
FIGS. 1 and 2 shows temporal progressions of phases in examples of deposition processes.

The present disclosure relates to formation of silicon-containing films, including SiN, SiCN and SiC films, particularly on semiconductor substrates. Methods described herein include low temperature processes to deposit the films.

DEFINITIONS

As used herein, the following definitions shall apply unless otherwise indicated.

A "silicon-containing reactant" is a reagent, single or mixture of reagents, used to make a SiN, SiCN, SiC or other Si-containing material, where the reagent contains at least one silicon compound. The silicon compound can be, for example, a silane, a halosilane or an aminosilane. A silane contains hydrogen and/or carbon groups, but does not contain a halogen. Examples of silanes are silane ($SiH_4$), disilane ($Si_2H_6$), and organo silanes such as methylsilane, ethylsilane, isopropylsilane, t-butylsilane, dimethylsilane, diethylsilane, di-t-butylsilane, allylsilane, sec-butylsilane, thexylsilane, isoamylsilane, t-butyldisilane, di-t-butyldisilane, and the like. A halosilane contains at least one halogen group and may or may not contain hydrogens and/or carbon groups. Examples of halosilanes are iodosilanes, bromosilanes, chlorosilanes and fluorosilanes. Although halosilanes, particularly fluorosilanes, may form reactive halide species that can etch silicon materials, in certain embodiments described herein, the silicon-containing reactant is not present when a plasma is struck. Specific chlorosilanes are tetrachlorosilane ($SiCl_4$), trichlorosilane ($HSiCl_3$), dichlorosilane ($H_2SiCl_2$), monochlorosilane ($ClSiH_3$), chloroallylsilane, chloromethylsilane, dichloromethylsilane, chlorodimethylsilane, chloroethylsilane, t-butylchlorosilane, di-t-butylchlorosilane, chloroisopropylsilane, chloro-sec-butylsilane, t-butyldimethylchlorosilane, thexyldimethylchlorosilane, and the like. An aminosilane includes at least one nitrogen atom bonded to a silicon atom, but may also contain hydrogens, oxygens, halogens and carbons. Examples of aminosilanes are mono-, di-, tri- and tetra-aminosilane ($H_3Si(NH_2)_4$, $H_2SKNH_2)_2$, $HSi(NH_2)_3$ and $Si(NH_2)_4$, respectively), as well as substituted mono-, di-, tri- and tetra-aminosilanes, for example, t-butylaminosilane, methylaminosilane, tert-butylsilanamine, bis(tertiarybutylamino)silane ($SiH_2(NHC(CH_3)_3)_2$ (BTBAS), tert-butyl silylcarbamate, $SiH(CH_3)$—$(N(CH_3)_2)_2$, $SiHCl$—$(N(CH_3)_2)_2$, $(Si(CH_3)_2NH)_3$ and the like. A further example of an aminosilane is trisilylamine ($N(SiH_3)$).

A "nitrogen-containing reactant" contains at least one nitrogen, for example, ammonia, hydrazine, amines (amines bearing carbon) such as methylamine, dimethylamine, ethylamine, isopropylamine, t-butylamine, di-t-butylamine, cyclopropylamine, sec-butylamine, cyclobutylamine, isoamylamine, 2-methylbutan-2-amine, trimethylamine, diisopropylamine, diethylisopropylamine, di-t-butylhydrazine, as well as aromatic containing amines such as anilines, pyridines, and benzylamines. Amines may be primary, secondary, tertiary or quaternary (for example, tetraalkylammonium compounds). A nitrogen-containing reactant can contain heteroatoms other than nitrogen, for example, hydroxylamine, t-butyloxycarbonyl amine and N-t-butyl hydroxylamine are nitrogen-containing reactants.

"Plasma" refers to a plasma ignited in a reaction chamber or remotely and brought into the reaction chamber. Plasmas can include the reactants described herein and may include other agents, for example, a carrier gas, or reactive species such as hydrogen gas. The reactants and other agents may be present in a reaction chamber when a plasma is struck, or a remote plasma may be flowed into a chamber where the reactants are present and/or the reactants and/or carrier gas may be ignited into a plasma remotely and brought into the reaction chamber. A "plasma" is meant to include any plasma known to be technologically feasible, including inductively-coupled plasmas and microwave surface wave plasmas. One of ordinary skill in the art would appreciate that advancements in technology will occur, and thus as yet developed plasma generating techniques are contemplated to be within the scope of the invention.

"Thermally removable group" refers to a moiety, on either or both of the nitrogen-containing reactant and the silicon-containing reactant, that breaks down into volatile components at between about 200° C. and about 550° C. Described herein are non-limiting examples such as secondary and tertiary carbon group, which undergo elimination reactions in this temperature range. One of ordinary skill in the art would recognize that other groups thermally decompose as described by other mechanisms, for example, a t-butyloxy-carbonyl (t-BOC or "BOC") group thermally decomposes via both an elimination mechanism where the t-butyl portion of the group forms isobutylene, but also the decomposition forms carbon dioxide. Thus a thermally removable group is not limited to a particular mechanism or combination of mechanisms. As long as the group breaks down under the specified temperature range to produce at least one volatile component, then it qualifies as a thermally decomposable group. For example, under a given set of conditions, t-butyl-ethylamine will undergo thermal decomposition of the t-butyl group to form isobutylene while the ethyl group remains, and thus isobutylene and ethylamine are the products of the thermal decomposition. One of ordinary skill in the art would recognize that the volatility of a component depends, in part, on the reaction conditions under which the component is generated. For example, isobutylene may be volatile and be removed from a reaction chamber under the conditions of heating and low press because it does not react with the adsorbed reactants, while, for example, ammonia, although generally a volatile compound, undergoes reaction with a silicon-containing reactant adsorbed on the surface of a substrate.

Methods

Described herein are methods of making SiN and other silicon-containing dielectric films, including SiCN and SiC films. In particular embodiments, silicon-containing films are made using UV-activated conformal film deposition (CFD). $Si_3N_4$ and other SiN films can be deposited, including Si-containing films that contain oxygen and/or carbon. While embodiments include CFD, the methods described herein are not limited to CFD. Other suitable methods include ALD, PEALD, CVD, PECVD, and plasma enhanced cyclic chemical vapor deposition (PECCVD). Methods for forming films using CFD are described in U.S. patent application Ser. No. 13/084,399, filed on Apr. 11, 2011, and which is incorporated by reference herein for all purposes. For context, a short description of CFD is provided.

Manufacture of semiconductor devices typically involves depositing one or more thin films on a non-planar substrate in an integrated fabrication process. In some aspects of the integrated process it may be useful to deposit conformal thin films. For example, a silicon nitride film may be deposited on top of an elevated gate stack to act as a spacer layer for protecting lightly-doped source and drain regions from subsequent ion implantation processes.

In spacer layer deposition processes, chemical vapor deposition (CVD) processes may be used to form a silicon nitride film on the non-planar substrate, which is then anisotropically etched to form the spacer structure. However, as a distance between gate stacks decreases, mass transport limitations of CVD gas phase reactions may cause "bread-loafing" deposition effects. Such effects typically exhibit thicker deposition at top surfaces of gate stacks and thinner deposition at the bottom corners of gate stacks. Further, because some die may have regions of differing device density, mass transport effects across the wafer surface may result in within-die and within-wafer film thickness variation. These thickness variations may result in over-etching of some regions and under-etching of other regions. This may degrade device performance and/or die yield.

Some approaches to addressing these issues involve atomic layer deposition (ALD). In contrast with a CVD process, where thermally activated gas phase reactions are used to deposit films, ALD processes use surface-mediated deposition reactions to deposit films on a layer-by-layer basis. In one example ALD process, a substrate surface, including a population of surface active sites, is exposed to a gas phase distribution of a first reactant (A). Some molecules of reactant A may form a condensed phase atop the substrate surface, including chemisorbed species and physisorbed molecules of reactant A. The reactor is then evacuated to remove gas phase and physisorbed reactant A so that only chemisorbed species remain. A second film reactant (B) is then introduced to the reactor so that some molecules of reactant B adsorb to the substrate surface. Thermal energy provided to the substrate activates surface reactions between adsorbed molecules of reactants A and B, forming a film layer. Finally, the reactor is evacuated to remove reaction by-products and unreacted reactant B, ending the ALD cycle. Additional ALD cycles may be included to build film thickness. Plasma, or other energetic means, may be used in conjunction with heating, or as alternatives to heating the substrate in order to drive the reaction between reactant A and B.

Depending on the exposure time of the reactant dosing steps and the sticking coefficients of the reactants, each ALD cycle may deposit a film layer of, in one example, between one-half and three angstroms thick. Thus, ALD processes may be time consuming when depositing films more than a few nanometers thick. Further, some reactants may have long exposure times to deposit a conformal film, which may also reduce wafer throughput time.

Conformal films may also be deposited on planar substrates. For example, antireflective layers for lithographic patterning applications may be formed from planar stacks including alternating film types. Such antireflective layers may be approximately 100 to 1000 angstroms thick, making ALD processes less attractive than CVD processes. However, such anti-reflective layers may also have a lower tolerance for within-wafer thickness variation than many CVD processes may provide. For example, a 600-angstrom thick antireflective layer may tolerate a thickness range of less than 3 angstroms.

Various embodiments described herein include CFD to deposit SiN, SiCN, SiC, SiO, SiON and SiOCN films and other silicon-containing films. Generally, CFD does not rely on complete purges of one or more reactants prior to reaction to form the silicon-containing film. For example, there may be one or more reactants present in the vapor phase when a plasma (or other activation energy) is struck. Accordingly, one or more of the process steps described in the ALD process may be shortened or eliminated in an example CFD process. Further, in some embodiments, plasma activation of deposition reactions may result in lower deposition temperatures than thermally-activated reactions, potentially reducing the thermal budget of an integrated process.

FIG. 1, shows a temporal progression of exemplary phases in a CFD process, 100, for various process parameters, for example, inert gas flow, reactant A, reactant B and when an energy source is switched on. In FIG. 1, two deposition cycles 110A and 110B are shown. One of ordinary skill in the art would appreciate that any suitable number of deposition cycles may be included in a CFD process to deposit a desired film thickness. Example CFD process parameters include, but are not limited to, flow rates for inert and reactant species, plasma power and frequency, ultraviolet light wavelength, duration and intensity, substrate temperature, and process station pressure.

The concept of a CFD "cycle" is relevant to the discussion of various embodiments herein. Generally a cycle is the minimum set of operations required to perform a surface deposition reaction one time. The result of one cycle is production of at least a partial film layer on a substrate surface. Typically, a CFD cycle will include only those steps necessary to deliver and adsorb each reactant to the substrate surface, and then react those adsorbed reactants to form the partial layer of film. The cycle may include certain ancillary steps such as sweeping one of the reactants or byproducts and/or treating the partial film as deposited. Generally, a cycle contains only one instance of a unique sequence of operations. As an example, a cycle may include the following operations: (i) delivery/adsorption of reactant A, (ii) delivery/adsorption of reactant B, (iii) sweep B out of the reaction chamber, and (iv) apply activation to drive a surface reaction of A and B to form the partial film layer on the surface.

Referring to FIG. 1, an inert gas is flowed during all phases of process 100. At reactant A exposure phase, 120A, reactant A is supplied at a controlled flow rate to a process station to saturate exposed surfaces of a substrate. Reactant A may be any suitable deposition reactant, for example, a nitrogen-containing reactant. In the embodiment shown in FIG. 1, reactant A flows continuously throughout deposition cycles 110A and 110B. Unlike a typical ALD process, where film precursor (reactant) exposures are separated to prevent gas phase reaction, reactants A and B may be allowed to mingle in the gas phase of some embodiments of a CFD process. Continuously supplying reactant A to the process station may reduce or eliminate a reactant A flow rate turn-on and stabilization time compared to an ALD process where reactant A is first turned on, then stabilized and exposed to the substrate, then turned off, and finally removed from a reactor. While the embodiment shown in FIG. 1 depicts reactant A exposure phase 120A as having a constant flow rate, it will be appreciated that any suitable flow of reactant A, including a variable flow, may be employed within the scope of the present disclosure. In some embodiments, reactant A exposure phase 120A may have a duration that exceeds a substrate surface saturation time for reactant A. For example, the embodiment of FIG. 1 includes a reactant A post-saturation exposure time 130 in reactant A exposure phase 120A. Optionally, reactant A exposure phase 120A may include a controlled flow rate of an inert gas. Example inert gases include, but are not limited to, nitrogen, argon, and helium. The inert gas may be provided to assist with pressure and/or temperature control of the process station, evaporation of a liquid reactant, more rapid delivery of the reactant and/or as a sweep gas for removing process gases from the process station and/or process station plumbing.

At reactant B exposure phase 140A of the embodiment shown in FIG. 1, reactant B is supplied at a controlled flow rate to the process station to saturate the exposed substrate surface. In this example, reactant B can be a silicon-containing reactant, for example. While the embodiment of FIG. 1 depicts reactant B exposure phase 140A as having a constant flow rate, it will be appreciated that any suitable flow of reactant B, including a variable flow, may be employed within the scope of the present disclosure. Further, it will be appreciated that reactant B exposure phase 140A may have any suitable duration. In some embodiments, reactant B exposure phase 140A may have a duration exceeding a substrate surface saturation time for reactant B. For example, the embodiment shown in FIG. 1 depicts a reactant B post-saturation exposure time 150 included in reactant B exposure phase 140A.

In some embodiments, surface adsorbed B species may exist as discontinuous islands on the substrate surface, making it difficult to achieve surface saturation of reactant B. Various surface conditions may delay nucleation and saturation of reactant B on the substrate surface. For example, ligands released on adsorption of reactants A and/or B may block some surface active sites, preventing further adsorption of reactant B. Accordingly, in some embodiments, continuous adlayers of reactant B may be provided by modulating a flow of and/or discretely pulsing reactant B into the process station during reactant B exposure phase 140A. This may provide extra time for surface adsorption and desorption processes while conserving reactant B compared to a constant flow scenario. Additionally, or alternatively, in some embodiments, one or more sweep phases may be included between consecutive exposures of reactant B.

Prior to activation, gas phase reactant B may be removed from the process station in sweep phase 160A in some embodiments. Sweeping the process station may avoid gas phase reactions where reactant B is unstable to plasma activation or where unwanted species might be formed. Further, sweeping the process station may remove surface adsorbed ligands that may otherwise remain and contaminate the film. Example sweep gases may include, but are not limited to, argon, helium, and nitrogen. In the embodiment shown in FIG. 1, sweep gas for sweep phase 160A is supplied by the continuous inert gas stream. In some embodiments, sweep phase 160A may include one or more evacuation subphases for evacuating the process station. Alternatively, it will be appreciated that sweep phase 160A may be omitted in some embodiments.

Sweep phase 160A may have any suitable duration. In some embodiments, increasing a flow rate of a one or more sweep gases may decrease the duration of sweep phase 160A. For example, a sweep gas flow rate may be adjusted according to various reactant thermodynamic characteristics and/or geometric characteristics of the process station and/or process station plumbing for modifying the duration of sweep phase 160A. In one non-limiting example, the duration of a sweep phase may be optimized by adjustment of the sweep gas flow rate. This may reduce deposition cycle time, which may improve substrate throughput.

At activation phase 180A of the embodiment shown in FIG. 1, energy is provided to activate surface reactions between surface adsorbed reactants A and B. For example, a plasma may directly or indirectly activate gas phase molecules of reactant A to form reactant A radicals. These radicals may then interact with surface adsorbed reactant B, resulting in film-forming surface reactions. In another example, ultraviolet (UV) radiation may directly or indirectly activate gas phase molecules of reactant A to form reactant A radicals, which may then interact with surface adsorbed reactant B.

According to various embodiments, activation phase 180A can include one or more of a direct (in situ) plasma, a remote plasma, UV radiation exposure, visible light radiation exposure and microwave radiation exposure. Activation phase 180A concludes deposition cycle 110A, which in the embodiment of FIG. 1 is followed by deposition cycle 110B, commencing with reactant A exposure phase 120B, and continuing with B exposure phase 140B, sweep phase 160B and plasma activation phase 180B.

In some embodiments, a plasma formed in activation phase 180A may be formed directly above the substrate surface. This may provide a greater plasma density and enhance a surface reaction rate between reactants A and B. For example, plasmas for CFD processes may be generated by applying a radio frequency (RF) field to a low-pressure gas using two capacitively coupled plates. Any suitable gas may be used to form the plasma. In this example, the inert gas such as argon or helium can be used along with reactant A, a nitrogen-containing reactant, to form the plasma. Ionization of the gas between the plates by the RF field ignites the plasma, creating free electrons in the plasma discharge region. These electrons are accelerated by the RF field and may collide with gas phase reactant molecules. Collision of these electrons with reactant molecules may form radical species that participate in the deposition process. It will be appreciated that the RF field may be coupled via any suitable electrodes. Non-limiting examples of electrodes include process gas distribution showerheads and substrate support pedestals. It will be appreciated that plasmas for CFD processes may be formed by one or more suitable methods other than capacitive coupling of an RF field to a gas.

In some embodiments, a plasma formed in activation phase 180A may be formed by in a remote plasma source. In some embodiments, activated species from a remote plasma source can enter the chamber housing the substrate and interact with the reactants. In some embodiments, these activated species include ions, electrons, radicals and high energy molecules. In some embodiments, the activated species that enter the chamber include radicals with substantially no ions and/or electrons, due to recombination prior to entering the chamber. An ion filter can be used in some embodiments. Examples of gases that may be fed into a remote plasma source, providing the activated species, include argon, helium, ammonia, hydrogen and oxygen.

In some embodiments, activation phase 180A can involve exposure to radiation from a UV light source. Any appropriate UV light source can be used including broadband and narrow band UV light sources. For example, radical species that participate in the deposition process may be formed by exposure to the UV radiation. In some embodiments, a UV light source may emit light of one or more wavelengths chosen to excite one or more reactants or activate a reaction. In some embodiments, UV exposure may occur when a reactant is in the reaction chamber. For example, a UV light source may be mounted within or outside the chamber. UV radiation may pass through a window to reach the reactant(s). In some other embodiments, UV exposure can occur prior to a reactant entering a chamber. For example, a reactant can be exposed to UV radiation prior to be inlet into a chamber, with radicals and/or other activated species entering the chamber. In these embodiments, activation phase 180A can be concurrent or overlap with a reactant exposure phase. Examples of such processes are described further below.

In some embodiments, activation phase 180A can involve exposure to radiation from a visible light source. For example, radical species that participate in the deposition process may be formed. In some embodiments, a visible light source may emit light of one or more wavelengths chosen to excite one or more reactants or activate a reaction. In some embodiments, visible light exposure may occur when a reactant is in the reaction chamber. For example, a light source may be mounted within or outside the chamber. Visible light may pass through a window to reach the reactant(s). In some other embodiments, exposure to visible light that excites a reactant can occur prior to a reactant entering a chamber. For example, a reactant can be exposed to the radiation prior to be inlet into a chamber, with radicals and/or other activated species entering the chamber. In these embodiments, activation phase 180A can be concurrent or overlap with a reactant exposure phase. Examples of such processes are described further below.

In some embodiments, activation phase 180A can involve exposure to microwave radiation. For example, radical species that participate in the deposition process may be formed. In some embodiments, a microwave source may emit light at one or more frequencies chosen to excite one or more reactants or activate a reaction. In some embodiments, microwave exposure may occur when a reactant is in the reaction chamber. For example, a microwave source may be mounted within or outside the chamber. Microwaves may pass through a window to reach the reactant(s). In some other embodiments, exposure to microwaves that excite a reactant can occur prior to a reactant entering a chamber. For example, a reactant can be exposed to the radiation prior to be inlet into a chamber, with radicals and/or other activated species entering the chamber. In these embodiments, activation phase 180A can be concurrent or overlap with a reactant exposure phase. Examples of such processes are described further below.

In some embodiments, activation phase 180A may involve one or more of the above-described modes of activation. Activation phase 180A may have any suitable duration. In some embodiments, activation phase 180A may have a duration that exceeds a time for activated radicals to interact with all exposed substrate surfaces and adsorbates, forming a continuous film atop the substrate surface. For example, the embodiment shown in FIG. 1 includes a post-saturation exposure time 190 in activation phase 180A.

In some embodiments, extending an activation energy exposure time and/or providing a plurality of exposure phases may provide a post-reaction treatment of bulk and/or near-surface portions of the deposited film. In one embodiment, decreasing surface contamination may prepare the surface for adsorption of reactant A. For example, a silicon nitride film formed from reaction of a silicon-containing reactant and a nitrogen-containing reactant may have a surface that may resist adsorption of subsequent reactants. Treating the silicon nitride surface with a plasma or other activation energy may create hydrogen bonds for facilitating subsequent adsorption and reaction events. In addition to plasma treatments, such treatments include electromagnetic radiation treatments, thermal treatments (e.g., anneals or high temperature pulses), and the like. Any of these treatments may be performed alone or in combination with another treatment, including a plasma treatment. In a specific embodiment, the treatment involves exposing the film to UV radiation. As described below, in a specific embodiment, the method involves the application of UV radiation to a film in situ (i.e., during formation of the film) or post deposition of the film. Such treatment serves to reduce or eliminate defect structure and provide improved electrical performance.

In certain specific embodiments, a UV treatment can be coupled with a plasma treatment. These two operations can be performed concurrently or sequentially. In the sequential option, either operation can take place first. In the concurrent option, the two treatments may be provided from separate sources (e.g., an RF power source for the plasma and a lamp for the UV) or from a single source such as a helium plasma that produces UV radiation as a byproduct.

In some embodiments, film properties, such as film stress, dielectric constant, refractive index, etch rate may be adjusted by varying plasma or other activation energy parameters.

While many examples discussed herein include two reactants (A and B), it will be appreciated that any suitable number of reactants may be employed within the scope of the present disclosure. In some embodiments, a single reactant and an inert gas used to supply plasma energy for a surface reaction can be used. Alternatively, some embodiments may use multiple reactants to deposit a film. For example, in some embodiments, a silicon nitride film may be formed by reaction of a silicon-containing reactant and one or more of a nitrogen-containing reactant, or one or more silicon-containing reactants and a single nitrogen-containing reactant, or more than one of both the silicon-containing reactant and the nitrogen-containing reactant.

Figure 2:
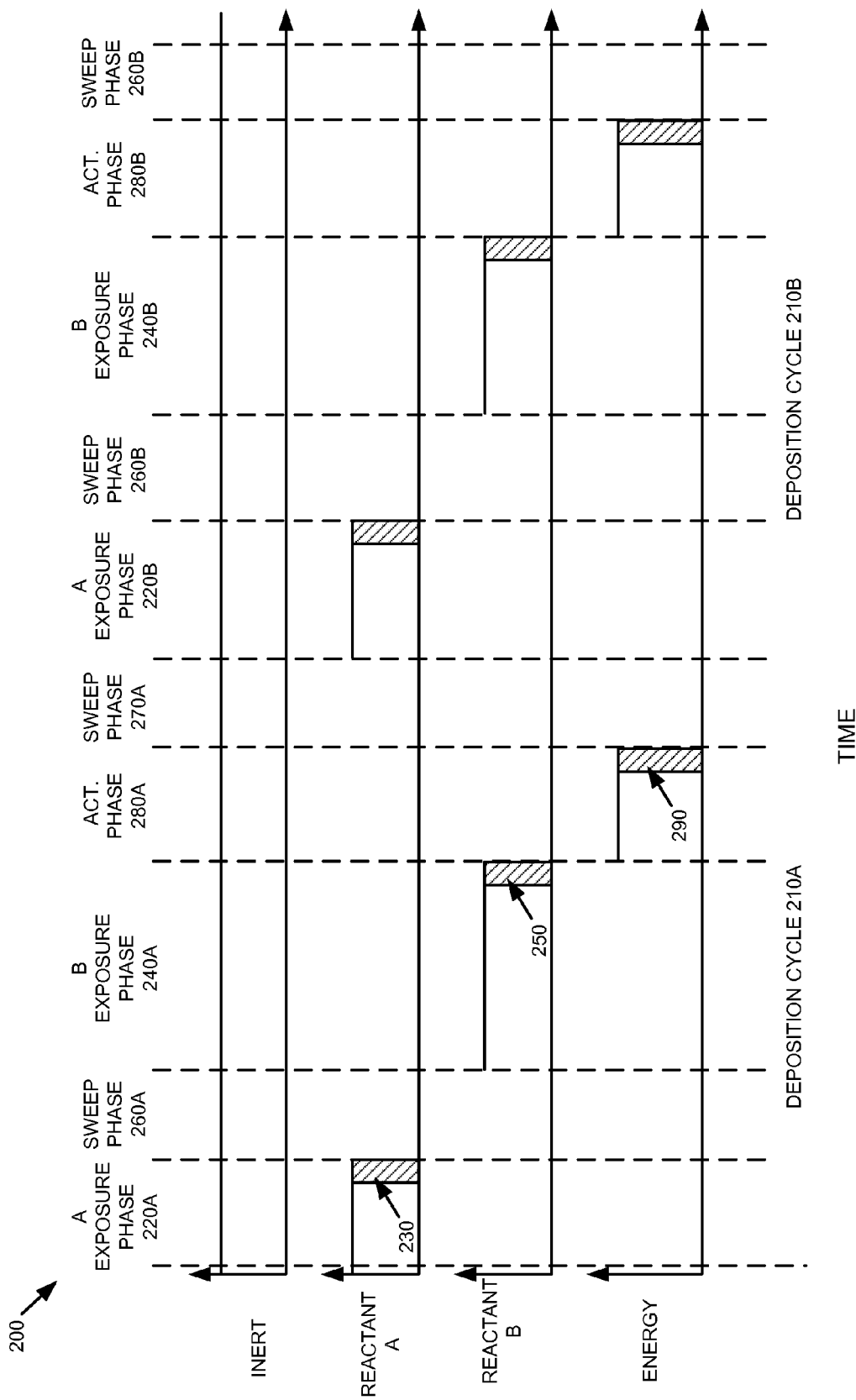

FIG. 2 shows another example of temporal progression of phases in a process, 200, for various process parameters, for example, inert gas flow, reactant A, reactant B and when an energy source is switched on. In FIG. 2, two deposition cycles 210A and 210B are shown. One of ordinary skill in the art would appreciate that any suitable number of deposition cycles may be included in a process to deposit a desired film thickness. Example process parameters include, but are not limited to, flow rates for inert and reactant species, plasma power and frequency, UV radiation wavelength, intensity duration, substrate temperature, process station pressure.

Referring to FIG. 2, an inert gas is flowed during all phases of process 200, though in other embodiments it may not be. At reactant A exposure phase, 220A, reactant A is supplied at a controlled flow rate to a process station to saturate exposed surfaces of a substrate. Reactant A may be any suitable deposition reactant, for example, a silicon-containing reactant. While the embodiment shown in FIG. 2 depicts reactant A exposure phase 220A as having a constant flow rate, it will be appreciated that any suitable flow of reactant A, including a variable flow, may be employed within the scope of the present disclosure. In some embodiments, reactant A exposure phase 220A may have a duration that exceeds a substrate surface saturation time for reactant A. For example, the embodiment of FIG. 2 includes a reactant A post-saturation exposure time 230 in reactant A exposure phase 220A. Optionally, reactant A exposure phase 220A may include a controlled flow rate of an inert gas. Example inert gases include, but are not limited to, nitrogen, argon, and helium. The inert gas may be provided to assist with pressure and/or temperature control of the process station, evaporation of a liquid reactant, more rapid delivery of the reactant and/or as a sweep gas for removing process gases from the process station and/or process station plumbing.

Gas phase reactant A may be removed from the process station in sweep phase 260A in some embodiments, prior to B exposure phase 240A. Sweeping the process station may purge any reactant A that is not adsorbed on the substrate surface. Example sweep gases may include, but are not limited to, argon, helium, and nitrogen. In the embodiment shown in FIG. 2, sweep gas for sweep phase 260A is supplied by the continuous inert gas stream. In some other embodiments, sweep gas may be supplied only during a sweep phase. In some embodiments, sweep phase 260A may include one or more evacuation subphases for evacuating the process station. Alternatively, it will be appreciated that sweep phase 260A may be omitted in some embodiments.

At reactant B exposure phase 240A of the embodiment shown in FIG. 2, reactant B is supplied at a controlled flow rate to the process station to saturate the exposed substrate surface. In this example, reactant B can be a nitrogen-containing reactant, for example. While the embodiment of FIG. 2 depicts reactant B exposure phase 240A as having a constant flow rate, it will be appreciated that any suitable flow of reactant B, including a variable flow, may be employed within the scope of the present disclosure. Further, it will be appreciated that reactant B exposure phase 240A may have any suitable duration. In some embodiments, reactant B exposure phase 240A may have a duration exceeding a substrate surface saturation time for reactant B. For example, the embodiment shown in FIG. 2 depicts a reactant B post-saturation exposure time 250 included in reactant B exposure phase 240A.

At activation phase 280A of the embodiment shown in FIG. 2, energy is provided to activate surface reactions between surface adsorbed reactants A and B. For example, a plasma may directly or indirectly activate gas phase molecules of reactant B to form reactant B radicals. These radicals may then interact with surface adsorbed reactant A, resulting in film-forming surface reactions. In another example, ultraviolet (UV) radiation may directly or indirectly activate gas phase molecules of reactant B to form reactant B radicals, which may then interact with surface adsorbed reactant A. Although B exposure phase 240A is shown in FIG. 2 as ending prior to activation phase 280A, in some embodiments, the two phases can overlap. According to various embodiments, activation phase 280A can include one or more of a direct (in situ) plasma, a remote plasma, UV radiation exposure, visible light radiation exposure and microwave radiation exposure, as described above.

Activation phase 280A may have any suitable duration. In some embodiments, activation phase 280A may have a duration that exceeds a time for activated radicals to interact with all exposed substrate surfaces and adsorbates, forming a continuous film atop the substrate surface. For example, the embodiment shown in FIG. 2 includes a post-saturation exposure time 290 in activation phase 280A.

FIG. 2 shows a sweep phase 270A performed after activation 280A. Gas phase reactant B may be removed from the process station in sweep phase 260A in some embodiments. Sweeping the process station may purge any gas phase reactant B as well as unwanted by products and/or contaminants. Example sweep gases may include, but are not limited to, argon, helium, and nitrogen. In the embodiment shown in FIG. 2, sweep gas for sweep phase 270A is supplied by the continuous inert gas stream, though it may otherwise be supplied. In sweep phase 270A may include one or more evacuation subphases for evacuating the process station. Alternatively, it will be appreciated that sweep phase 270A may be omitted in some embodiments. Sweep phase 270A concludes deposition cycle 210A, which in the embodiment of FIG. 2 is followed by deposition cycle 210B, commencing with reactant A exposure phase 220B, and continuing with sweep phase 260B, B exposure phase 240B, plasma activation phase 280B, and sweep phase 270B.

Figure 3:
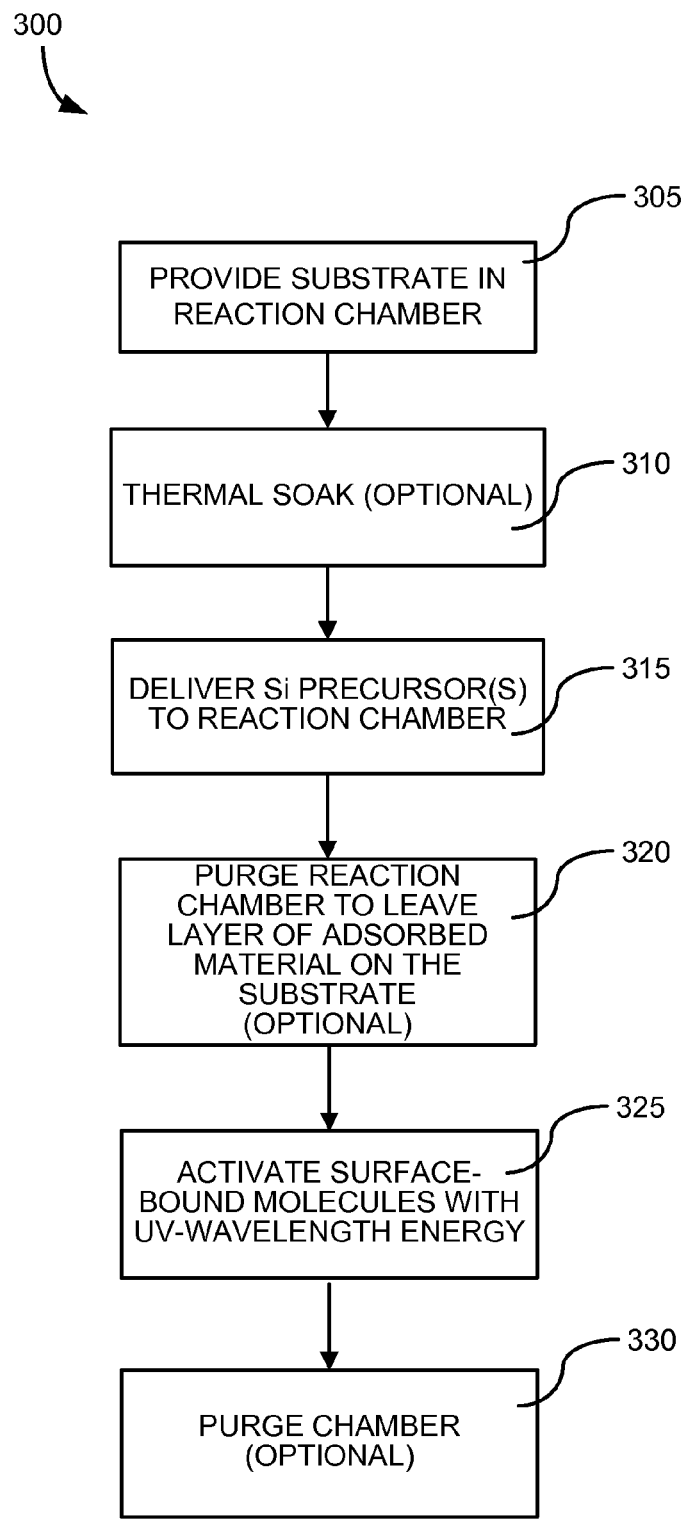
FIGS. 3 and 4 show example process flows for making a Si-containing film.

FIG. 3 depicts a process flow 300, outlining aspects of an embodiment of a method. A substrate is provided to a reaction chamber, see 305. An optional thermal soak can be performed, see 310, to heat the substrate to a desired temperature. In one embodiment, using any of the methods described herein, the substrate is heated to between about 50° C. and about 550° C., or more particularly from about 300° C. to about 450° C., for example about 350° C. or 400° C. One or more Si-containing precursors are then delivered to the chamber, see 315. In some embodiments, operation 415 can include delivering a coreactant in addition to the silicon-containing reactant, such as oxidant (e.g., for deposition of silicon oxides or silicon oxynitrides) and/or a nitrogen-containing precursor (e.g., for deposition of silicon nitrides or silicon oxynitrides). The one or more Si-containing precursors can be adsorbed, e.g., chemi- or physi-sorbed, on the substrate surface. An optional purge operation can then be performed, see 320, to leave adsorbed material on the substrate surface. The surface-bound molecules can be activated with UV energy, see 325. According to various embodiments, the UV energy can interact with one or more of a surface bound silicon-containing reactant and a surface bound coreactant. In some embodiments, a UV wavelength or range of UV wavelengths may be chosen to interact with one or more ligands on the reactant(s). As a result of the UV radiation, a reaction forming a desired silicon-containing film such as SiN, SiC, $SiO_2$, SiCN, SiON or SiONC, is activated. For example, a carbon-containing Si-precursor and a nitrogen-containing co-reactant can be used to form SiCN. An oxygen- and carbon-containing Si-precursor and a nitrogen-containing co-reactant can be used to form SiONC. In some implementations, a co-reactant can be an oxidizer that can be used to deposit SiO. For example, an oxygen- and carbon-containing Si-precursor and an oxidizer can be used to form silicon oxides. The process 300 can then continue with an optional purge, see 330, to leave only a layer of the SiN, $SiO_2$, SiCN, SiON, SiONC or other film on the substrate. Operations 315-330 can be repeated to form a film of the desired thickness.

In certain embodiments, another energy source may be used in addition to or instead of the UV energy in operation 325. For example, the UV radiation in operation 325 may be used in conjunction with a plasma. In some embodiments, microwave and/or visible light radiation may be used instead of or in addition to the UV radiation.

Figure 4:
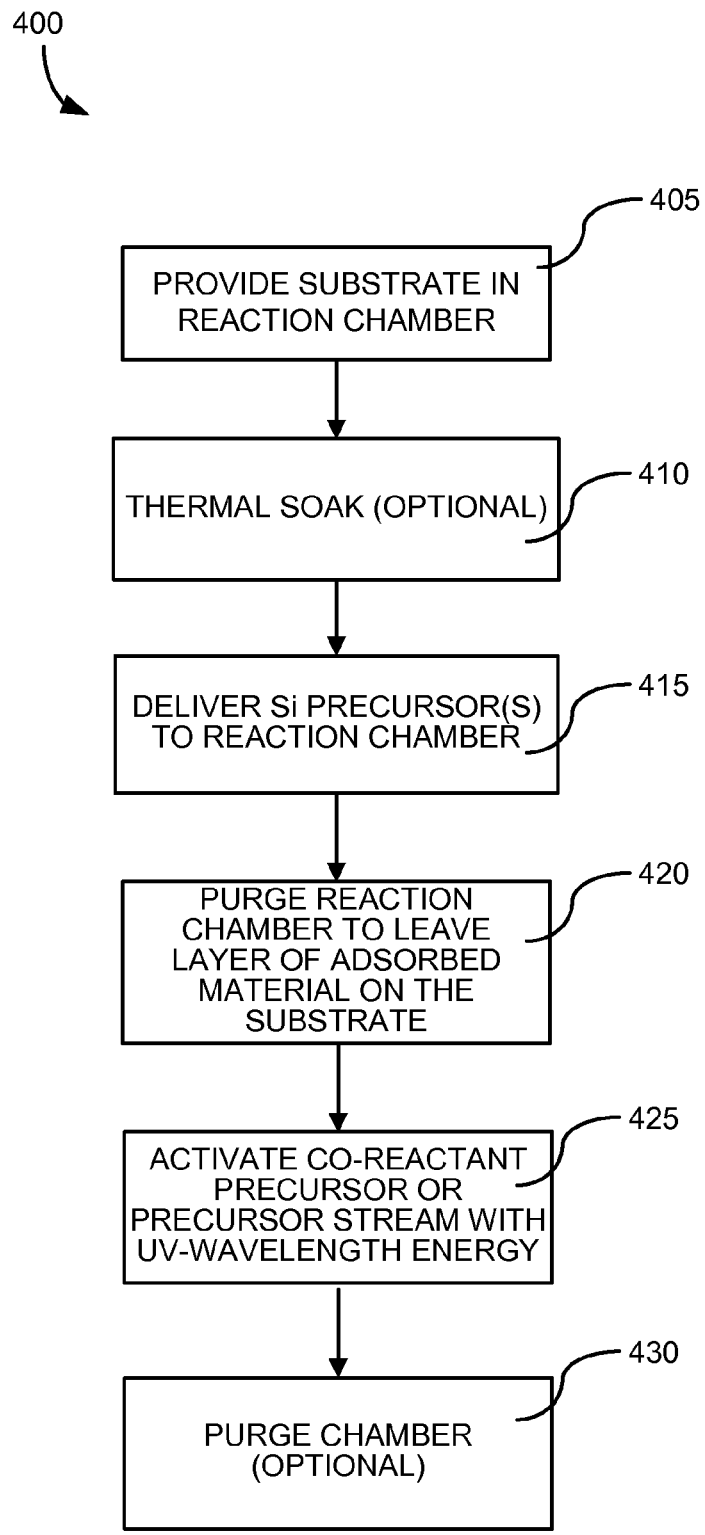

FIG. 4 depicts a process flow 400, outlining aspects of an embodiment of a method. A substrate is provided to the chamber, see 405. An optional thermal soak is performed as described above, see 410. One or more Si-containing precursors are then delivered to the chamber, see 415. The one or more precursors can be adsorbed, e.g., chemi- or physi-sorbed, on the substrate surface. The process 400 can then continue with an optional purge, see 420, to leave a layer of adsorbed material on the substrate. According to various embodiments, the layer can include a surface bound Si-containing reactant. A co-reactant precursor or precursor stream can be activated with UV-wavelength energy, see 425. For example, a nitrogen-containing reactant and/or an oxidant can be activated in the vapor phase in or upstream of the reaction chamber. In some embodiments, both surface-adsorbed silicon containing reactants and vapor phase coreactants reactants can be activated. As a result of the UV radiation, a reaction forming a desired silicon-containing film such as SiN, SiCN, SiC, SiO, SiON or SiONC, is activated. The process 400 can then continue with an optional purge, see 430, to leave only a layer of the SiN, SiCN, SiC, SiO, SiON or SiONC or other silicon-containing film on the substrate. Operations 415-430 can be repeated to form a film of the desired thickness.

Figure 5:
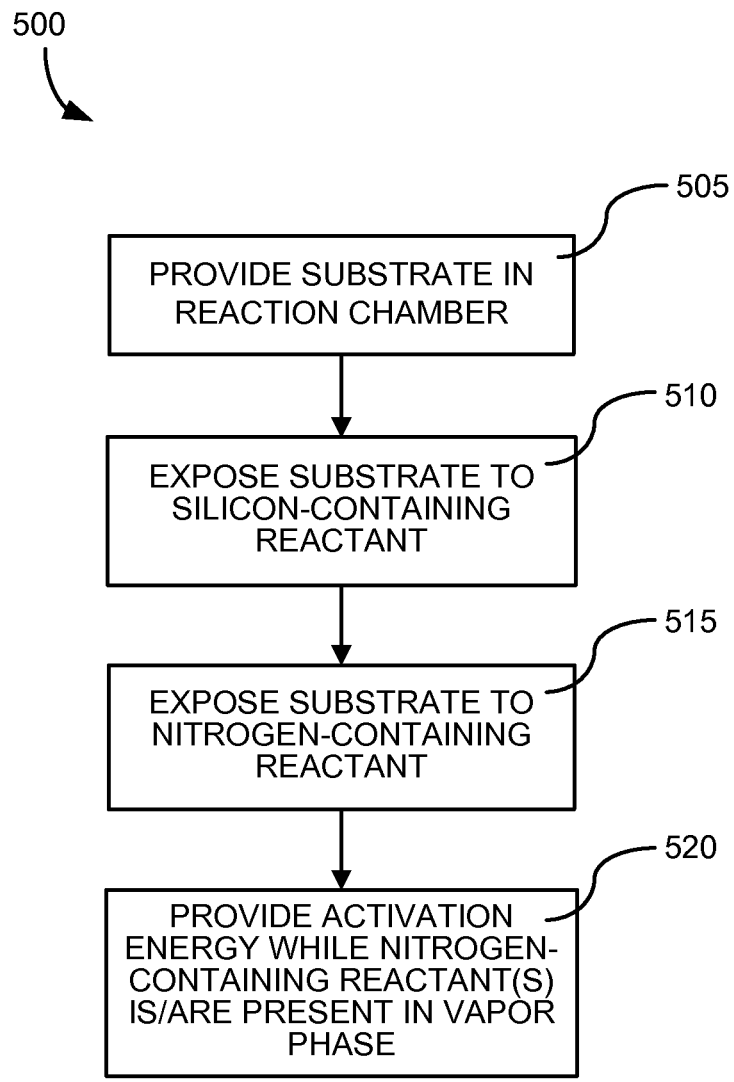
FIG. 5 shows an example process flow for making a SiN film.

FIG. 5 depicts an example of a process flow according to certain embodiments for forming a silicon-containing film. It will be appreciated that the processes as illustrated in FIG. 5 may be used to form SiCN, SiONC and SiON films depending on the particular Si-containing and N-containing reactants used. Forming SiONC and SiON films may include using an oxygen-containing co-reactant in addition to the nitrogen-containing reactant in block 515. Further, the process as illustrated in FIG. 5 can be used to form SiO, for example, by using an oxygen-containing reactant instead of the nitrogen-containing reactant in block 515. Examples of oxygen-containing co-reactants include $O_2$.

The process 500 begins with a substrate being provided to a chamber, see 505. The substrate can be any appropriate substrate on which the silicon-containing film is desired. For example, the substrate can be a partially fabricated integrated circuit, flash memory or phase-change memory substrate. The substrate can be provided as a bare substrate, e.g., a bare silicon substrate, or with one or more layers deposited thereon. The surface on which the SiN or other silicon-containing film is to be deposited can be or include, for example, silicon, polysilicon, copper, titanium, tungsten, silicon dioxide, or a germanium-antimony-tellurium (GST) alloy. In some embodiments, the surface includes one or more raised or recessed features. The one or more raised features can have aspect ratios of 2:1-10:1, for example. The substrate is exposed to a silicon-containing reactant, see 510. In some embodiments, operation 510 is a non-plasma operation. The reactor can be pressurized, in some embodiments, to a first pressure between about 5 and 50 Torr, for example. In a particular embodiment, pressure is about 20 Torr during operation 510. Pressures outside this range may be used according to the desired embodiment. The silicon-containing reactant is adsorbed on the substrate surface. After the desired amount of the silicon-containing reactant is adsorbed on the surface, the flow of silicon-containing reactant can be stopped (not shown). The substrate is exposed to one or more nitrogen-containing reactants, see 515. Activation energy is provided while the nitrogen-containing reactant is present in the vapor phase, see 520, thus forming a SiN or other Si- and N-containing film on the substrate. According to various embodiments, the nitrogen-containing reactant may be flowed continuously through-out the process (e.g., as reactant A is in FIG. 1) or flow intermittently (e.g., as reactant B is in FIG. 2). In some embodiments of the former case, operation 520 may be performed intermittently, while in some embodiments of the latter case, the energy source may be left on even when nitrogen-containing reactants are not present.

According to various embodiments, operation 520 can include one or more of a direct (in situ) plasma, a remote plasma, UV radiation exposure, visible light radiation exposure and microwave radiation exposure.

For example, in some embodiments, operation 520 can include a direct plasma formed directly above the substrate surface. This may provide a greater plasma density and enhance a surface reaction rate between reactants. For example, plasmas may be generated by applying a radio frequency (RF) field to a low-pressure gas using two capacitively coupled plates. Any suitable gas may be used to form the plasma. Ionization of the gas between the plates by the RF field ignites the plasma, creating free electrons in the plasma discharge region. These electrons are accelerated by the RF field and may collide with gas phase reactant molecules. Collision of these electrons with reactant molecules may form radical species that participate in the deposition process. It will be appreciated that the RF field may be coupled via any suitable electrodes. Non-limiting examples of electrodes include process gas distribution showerheads and substrate support pedestals. It will be appreciated that plasmas may be formed by one or more suitable methods other than capacitive coupling of an RF field to a gas.

In some embodiments, remotely generated or downstream plasma may provide all or part of the activation energy in 520. In some embodiments, activated species from a remote plasma source can enter the chamber housing the substrate and interact with the reactants. In some embodiments, these activated species include ions, electrons, radicals and high energy molecules. In some embodiments, the activated species that enter the chamber include radicals with substantially no ions and/or electrons, due to recombination prior to entering the chamber. In some embodiments, block 520 can occur prior to block 515 by providing the nitrogen-containing reactant or other co-reactant to the remote plasma generator; for example, an ammonia co-reactant can be fed to a remote plasma source in the formation of SiN, SiCN, SiOCN, and SiON films. In another example, oxygen can be fed to a remote plasma source in the formation of SiO films, SiOCN and SiON films.

In some embodiments, operation 520 can involve exposure to radiation from a UV light source. Any appropriate UV light source can be used including broadband and narrow band UV light sources. For example, radical species that participate in the deposition process may be formed by exposure to the UV radiation. In some embodiments, a UV light source may emit light of one or more wavelengths chosen to excite one or more reactants or activate a reaction. In some embodiments, UV exposure may occur when the nitrogen-containing reactant is in the reaction chamber. For example, a UV light source may be mounted within or outside the chamber. UV radiation may pass through a window to reach the reactant(s). In some other embodiments, UV exposure can occur prior to the nitrogen-containing reactant entering a chamber. For example, the reactant can be exposed to UV radiation prior to be inlet into the chamber, with radicals and/or other activated species entering the chamber.

According to various embodiments, the UV radiation can be broadband or a narrow band selected to activate a co-reactant or other species. For example, wavelengths that can be used to activate ammonia, and primary, secondary and tertiary amines are less than about 240 nm. wavelengths that can be used to activate oxygen are less than about 300 nm. Example intensities can be about 0.5 W/cm$^2$ over the entire UV range for a broadband source or about 10 mW/cm$^2$ for a single wavelength excimer.

In some embodiments, operation 520 can involve exposure to radiation from a visible light source. For example, radical species that participate in the deposition process may be formed. In some embodiments, a visible light source may emit light of one or more wavelengths chosen to excite one or more reactants or activate a reaction. In some embodiments, visible light exposure may occur when the nitrogen-containing reactant is in the reaction chamber. For example, a light source may be mounted within or outside the chamber. Visible light may pass through a window to reach the reactant(s). In some other embodiments, exposure to visible light that excites the nitrogen-containing reactant can occur prior to the reactant entering a chamber. For example, the reactant can be exposed to the radiation prior to be inlet into a chamber, with radicals and/or other activated species entering the chamber.

In some embodiments, operation 520 can involve exposure to microwave radiation. For example, radical species that participate in the deposition process may be formed. In some embodiments, a microwave source may emit light at one or more frequencies chosen to excite one or more reactants or activate a reaction. In some embodiments, microwave exposure may occur when the nitrogen-containing reactant is in the reaction chamber. For example, a microwave source may be mounted within or outside the chamber. Microwaves may pass through a window to reach the reactant(s). In some other embodiments, exposure to microwaves that excite the nitrogen-containing reactant can occur prior to the reactant entering the chamber. For example, the reactant can be exposed to the radiation prior to be inlet into a chamber, with radicals and/or other activated species entering the chamber.

In some embodiments, the pressure in the reactor is cycled such that it is lower during operations 515 and/or 520 than operation 510. For example, the pressure during these operations can be between about 1 and 5 Torr, for example 2 Torr. The flow of the nitrogen-containing reactant(s) can be stopped (not shown) after 520 in some embodiments. In some embodiments, the silicon-containing reactant and/or nitrogen-containing reactant can be purged. One or more iterations of 510-520 can be performed to build up a SiN or other Si-containing layer. In one embodiment, these operations are repeated to form a conformal layer on the substrate between about 1 nm and about 100 nm thick. In another embodiment, between about 5 nm and about 50 nm thick. In another embodiment, between about 5 nm and about 30 nm thick.

In one embodiment, using any of the methods described herein, the substrate is heated to between about 50° C. and about 550° C., or more particularly from about 300° C. to about 450° C., for example about 350° C. or 400° C. In one embodiment, the substrate is heated throughout the deposition, in other embodiments the substrate is heated periodically during the deposition or after the deposition steps as an anneal.

FIGS. 6-13 provide examples of temporal progressions of one or two SiN deposition cycles for various process parameters, for example, a silicon-containing precursor flow, a nitrogen-containing reactant, and UV light source intensity. Other parameters, such as inert gas flow, that may be present are not shown for ease of illustration. While the description of FIGS. 6-13 chiefly refer to SiN films, it will be appreciated that other reactants may be used in addition to or instead of the nitrogen-containing reactants to form, for example, SiO2, SiCN or SiONC. Similarly, it will be appreciated that the processes as illustrated in FIGS. 6-13 may be used to form SiCN, SiOCN and SiON films depending on the particular Si-containing and N-containing reactants used. Similarly, while FIGS. 6-13 refer to UV energy, it will be appreciated that one or more other energy sources as discussed above may be used in addition to or instead of UV energy.

In certain embodiments, the silicon-containing reactant may be UV transparent, while the nitrogen-containing reactant can be UV-activated. In certain other embodiments, the silicon-containing reactant can include a ligand that can be UV-activated. For example, NH$_3$ can be activated by UV radiation having a wavelength of less than about 240 nm. O$_2$-containing ligands can be activated by UV radiation of less than about 240 nm. SiH$_4$ and most of its derivatives can be activated by UV radiation have a wavelength less than about 200 nm.

Figure 6:
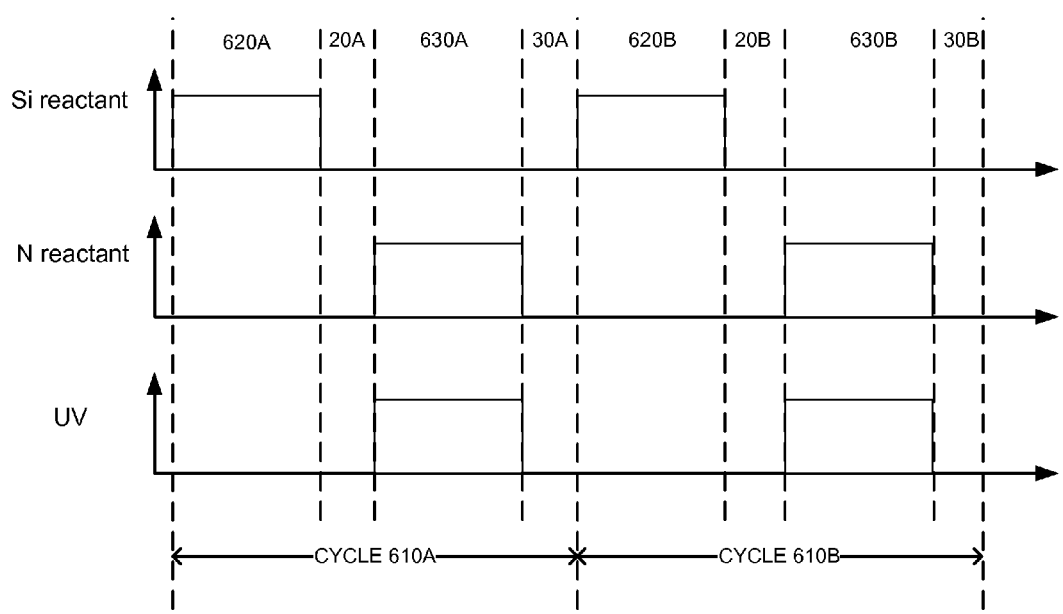
FIGS. 6-13 shows temporal progressions of phases in examples of SiN deposition processes.

First, FIG. 6 shows two cycles 610A and 610B, each of which results in deposition on of a layer of SiN. Deposition cycle 610A begins with a Si-containing reactant flow in a phase 620A. While the embodiment shown in FIG. 6 depicts phase 620A as having a constant flow rate of the Si-containing reactant, it will be appreciated that any suitable flow of any reactant shown in the figures, including a variable flow, may be employed. An optional purge phase 20A follows phase 620A. A nitrogen-containing reactant is flowed into the chamber in phase 630A. Also during this phase, UV light is switched on such that the vapor phase molecules and/or surface-bound molecules in the chamber are exposed to, and may be activated by, UV radiation. In particular, vapor phase nitrogen-containing reactant can be activated by the UV radiation. Although the embodiment shown in FIG. 6 depicts the UV intensity as constant, it will be appreciated that it can be variable or pulsed. Moreover, in some embodiments, the UV radiation may overlap temporally with the nitrogen-containing flow but start or stop before or after it. Cycle 610A concludes with an optional purge 30A. A second cycle 610B is depicted including phases 620B and 630B and optional purge phases 20B and 30B.

Figure 7:
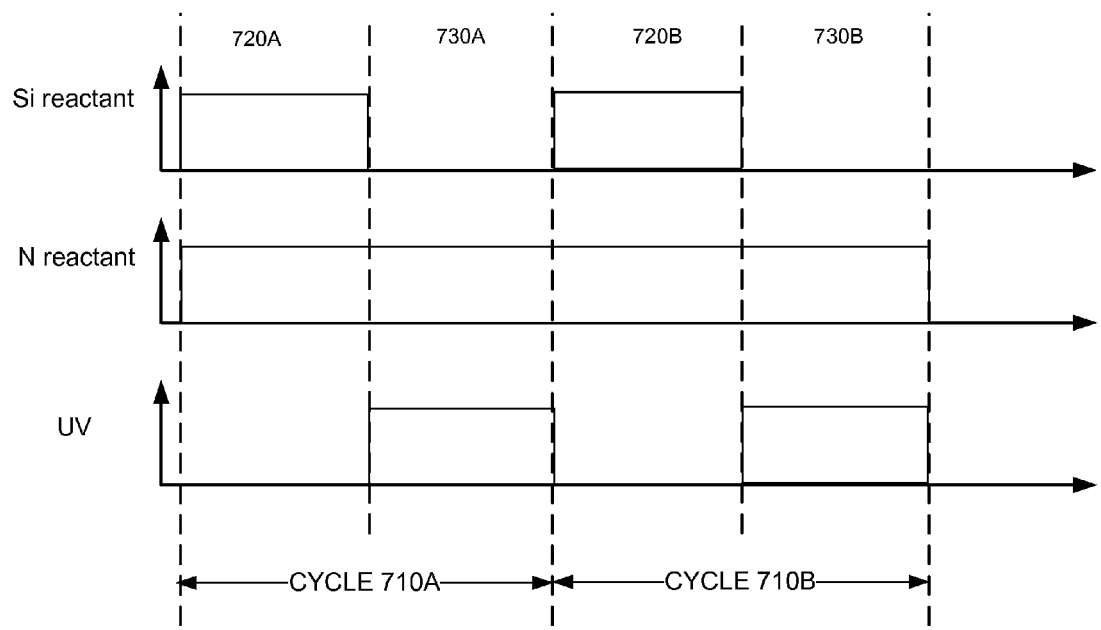

FIG. 7 shows two cycles 710A and 710B, with cycle 710A including phase 720A followed by phase 730A and cycle 710B including phase 720B followed by phase 730B. Phases 720A and 720B include flows of both a Si-containing reactant and a nitrogen-containing reactant, with no UV. Although not depicted, these phases can be followed by optional purge phases in some embodiments. The nitrogen-containing reactant continues to flow in phases 730A and 730B, with the UV light also turned on in these phases.

Figure 8:
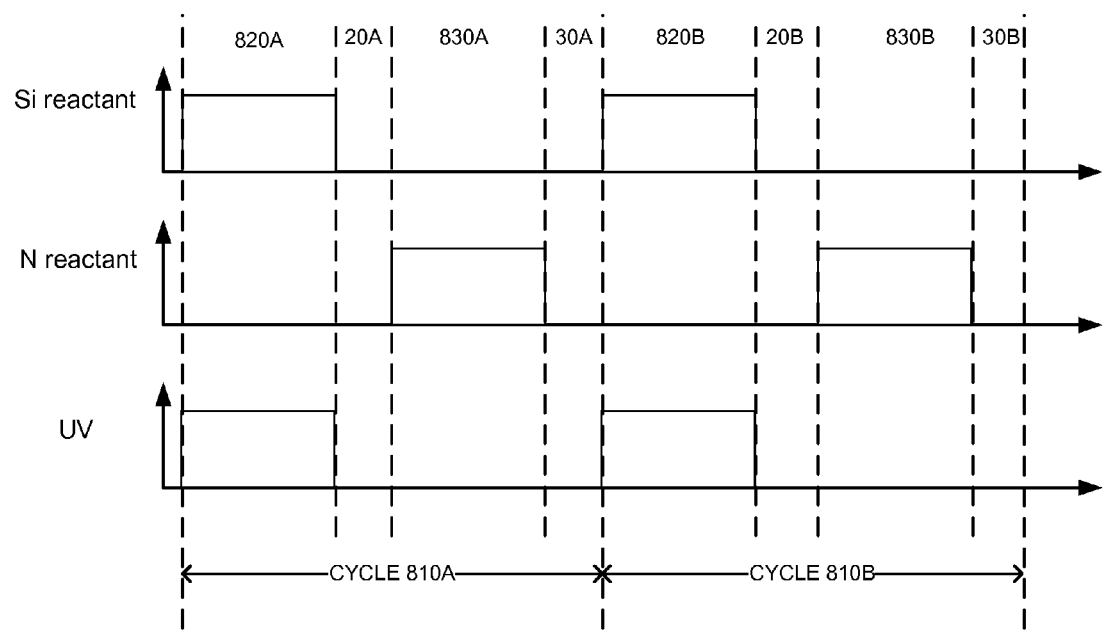

FIG. 8 depicts two cycles 810A and 810B of an embodiment in which UV light is on while a silicon-containing reactant if flowed in a chamber in phases 820A and 820B of the cycles 810A and 810B respectively. The UV light may activate surface bound Si-containing molecules. In some embodiments, there may be a delay between flowing the silicon-containing reactant and switching on the UV radiation. Optional purge operations 20A and 20B may follow phases 820A and 820B, respectively, before a nitrogen-containing reactant is flowed into the chamber in phases 830A and 830B. Each cycle may end with an optional purge operation 30A or 30B.

Figure 9:
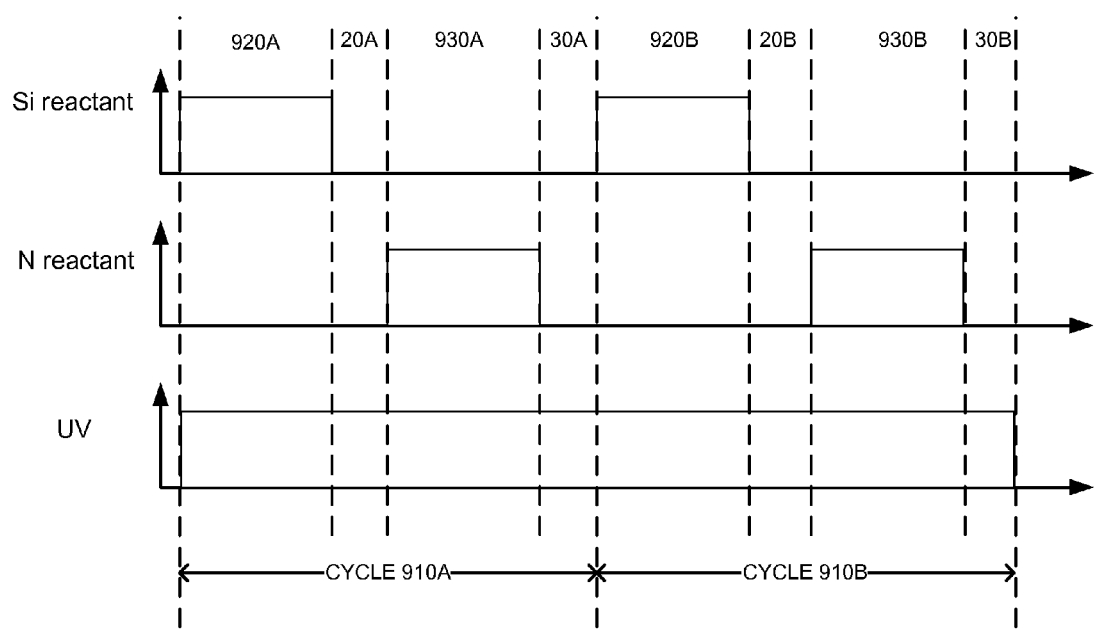

FIG. 9 shows two cycles 910A and 910B of an example embodiment in which UV light is on for the duration of each cycle. Each cycle includes a flow of silicon-containing reactant (phase 920A in cycle 910A and phase 920B in cycle 910B), followed by an optional purge phase (phase 20A in cycle 910A and phase 20B in cycle 910B) and a flow of nitrogen-containing reactant (phase 930A in cycle 910A and phase 930B in cycle 910B) followed by an optional purge phase (phase 30A in cycle 910A and phase 30B in cycle 910B). In some embodiments, the UV light may be switched off during portions of cycles 910A and 910B, for example during the optional purge phases, if performed.

Figure 10:
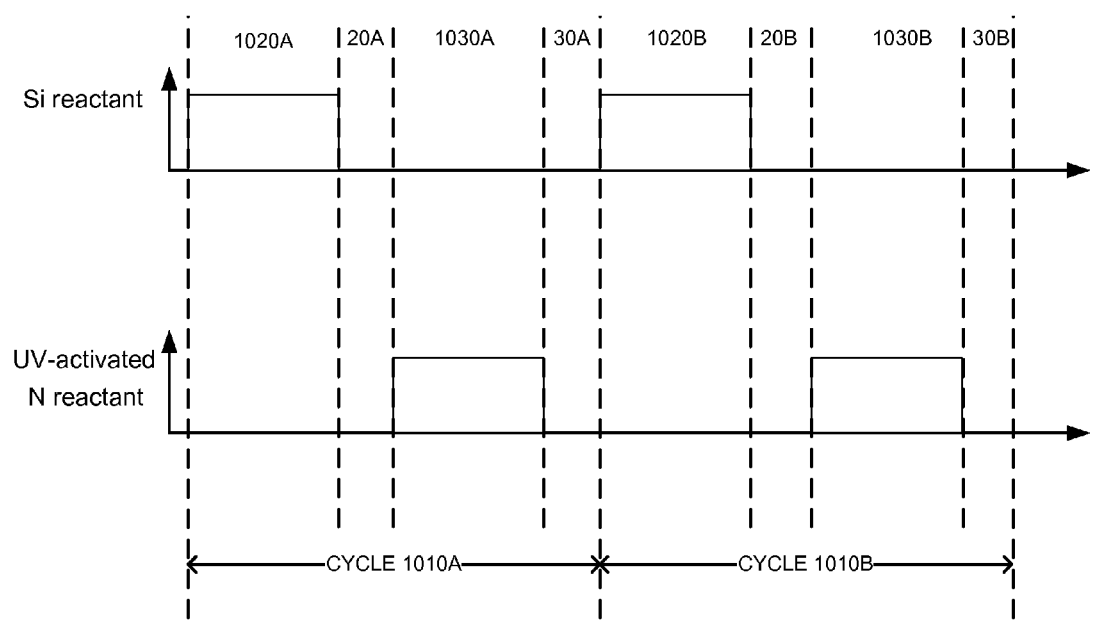

FIG. 10 shows two cycles 1010A and 1010B of an example embodiment in which the nitrogen-containing reactant enters the reaction chamber after having been activated by UV radiation. Deposition cycle 1010A includes a flow of a Si-containing reactant (phase 1020A) followed by an optional purge phase 20A. The UV-activated nitrogen-containing reactant is then flowed into the chamber (phase 1030A) where it can react with surface-bound Si-containing reactant forming a layer of SiN. An optional purge phase 30A can then be performed to end the cycle 1010A. Deposition cycle 1010B includes phases 1020B and 1030B and optional purge phases 20B and 30B.

Figure 11:
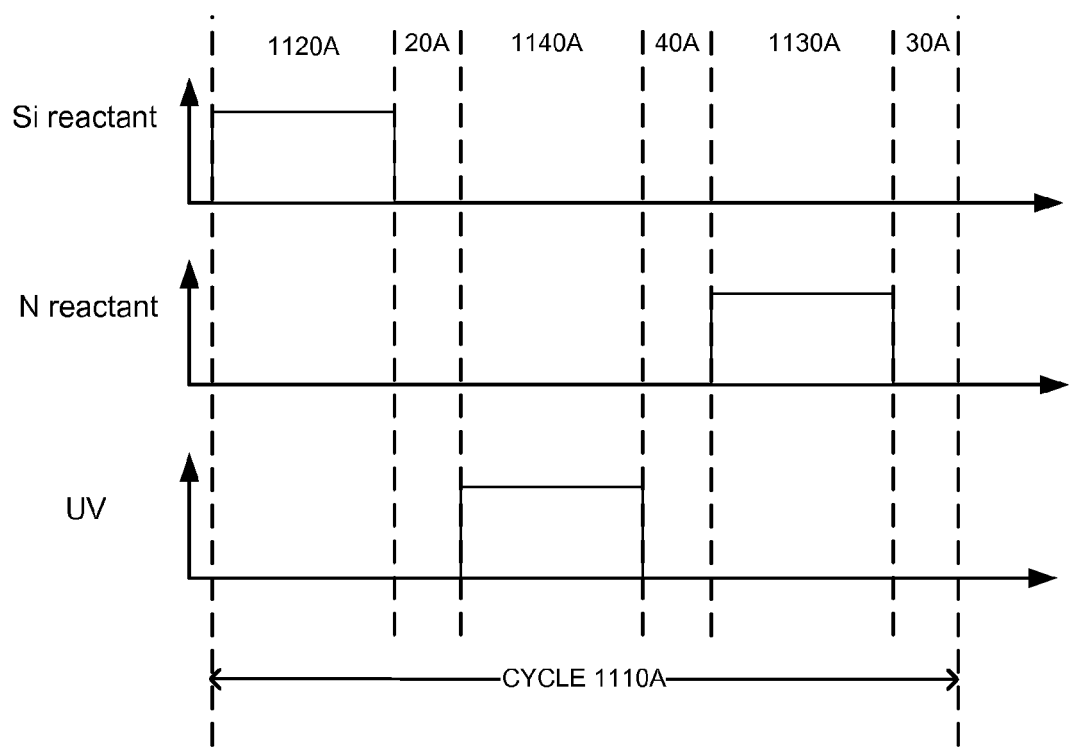
Figure 12:
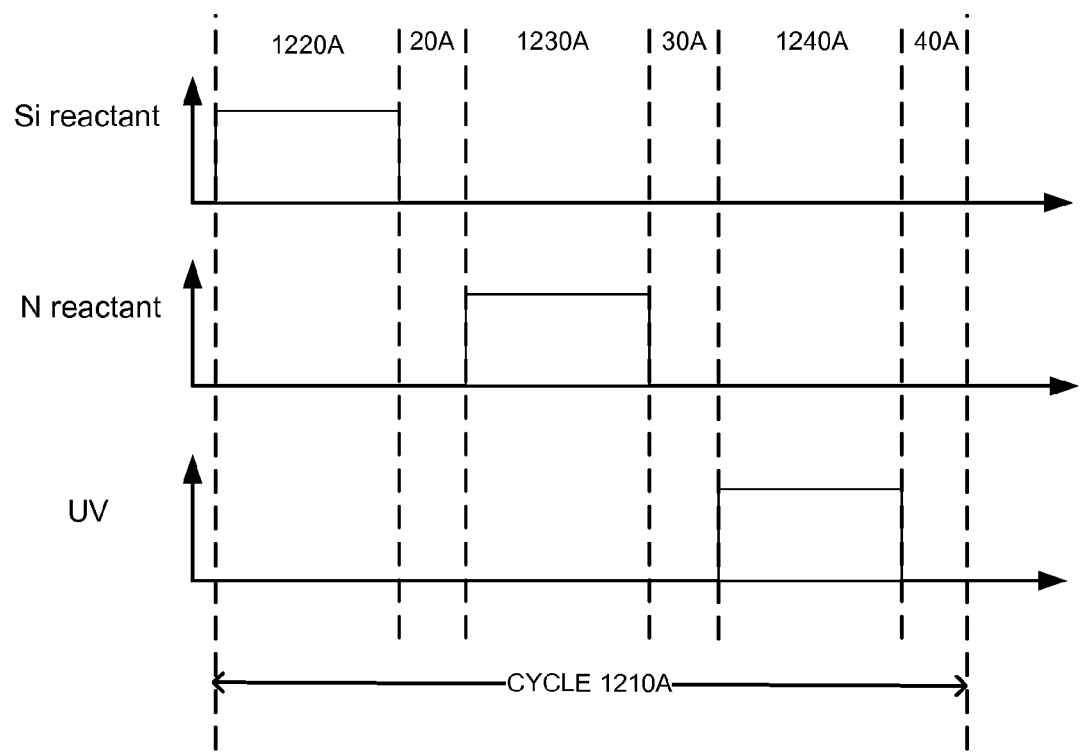

FIGS. 11 and 12 show examples three-stage cycles of deposition processes in which the SI-containing reactant flow, the nitrogen-containing reactant flow and the UV exposure are sequential. First, FIG. 11 depicts a deposition cycle 1110A that begins with flowing the Si-containing reactant in a phase 1120A. This is followed by an optional purge 20A. Next, the UV light source is switched on to expose at least surface-bound Si-containing reactant to UV radiation in a phase 1140A. Phase 1140A can also be followed by an optional purge phase 40A. Then, the nitrogen-containing reactant is flowed into the reactor to react with activated surface-bound Si-containing reactant in a phase 1130A. SiN is formed. The cycle can end after this phase, or after an optional purge phase 30A. Additional cycles can be performed to deposit a SiN film of the desired thickness.

FIG. 12 shows a deposition cycle 1210A that begins with flowing the Si-containing reactant in a phase 1220A followed by an optional purge 20A. Next, the nitrogen-containing reactant is flowed into the reactor in a phase 1230A, followed by an optional purge 30A. The reactants are exposed to UV radiation in a phase 1240A, activating a reaction to form SiN. One or both of the surface-bound silicon-containing reactant and nitrogen-containing reactant can be activated. In some embodiments, optional purge 30A is not performed, such that vapor phase nitrogen-containing reactant may be present during phase 1240A. After UV exposure, an optional purge 40A can be performed, leaving a solid layer of SiN material, and ending the cycle 1210A. Additional cycles can be performed as needed to deposit a film of the desired thickness. In some embodiments, a UV exposure phase may also occur after phase 1220A and prior to phase 1230A (e.g., as in FIG. 11) in addition to occurring after phase 1230A.

Figure 13:
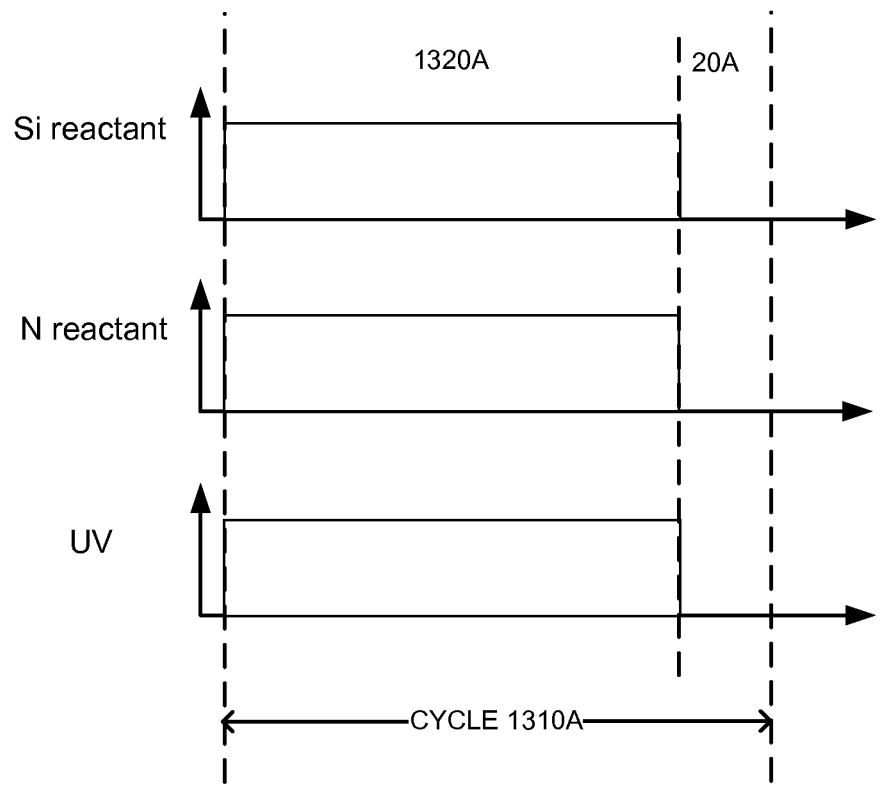

FIG. 13 depicts a temporal progression of an example of an embodiment in which the Si-containing reactant and nitrogen-containing reactant are flowed together in the presence of UV radiation in phase 1320A. For example, the Si-containing reactant can be UV transparent, while the nitrogen-containing reactant is activated. This can then generates radicals on the silicon-containing reactant which then gets deposited. An optional purge phase 20A may follow phase 1320A to complete cycle 1310A. One or more additional cycles may be performed.

Reactants

As noted above, examples of silicon-containing reactants can include a silane, a halosilane or an aminosilane. A silane contains hydrogen and/or carbon groups, but does not contain a halogen. Examples of silanes are silane ($SiH_4$), disilane ($Si_2H_6$), and organo silanes such as methylsilane, ethylsilane, isopropylsilane, t-butylsilane, dimethylsilane, diethylsilane, di-t-butylsilane, allylsilane, sec-butylsilane, thexylsilane, isoamylsilane, t-butyldisilane, di-t-butyldisilane, and the like. A halosilane contains at least one halogen group and may or may not contain hydrogens and/or carbon groups. Examples of halosilanes are iodosilanes, bromosilanes, chlorosilanes and fluorosilanes. Although halosilanes, particularly fluorosilanes, may form reactive halide species that can etch silicon materials, in certain embodiments described herein, the silicon-containing reactant is not present when a plasma is struck. Specific chlorosilanes are tetrachlorosilane ($SiCl_4$), trichlorosilane ($HSiCl_3$), dichlorosilane ($H_2SiCl_2$), monochlorosilane ($ClSiH_3$), chloroallylsilane, chloromethylsilane, dichloromethylsilane, chlorodimethylsilane, chloroethylsilane, t-butylchlorosilane, di-t-butylchlorosilane, chloroisopropylsilane, chloro-sec-butylsilane, t-butyldimethylchlorosilane, thexyldimethylchlorosilane, and the like. An aminosilane includes at least one nitrogen atom bonded to a silicon atom, but may also contain hydrogens, oxygens, halogens and carbons. Examples of aminosilanes are mono-, di-, tri- and tetra-aminosilane ($H_3Si(NH_2)_4$, $H_2Si(NH_2)_2$, $HSi(NH_2)_3$ and $Si(NH_2)_4$, respectively), as well as substituted mono-, di-, tri- and tetra-aminosilanes, for example, t-butylaminosilane, methylaminosilane, tert-butylsilanamine, bis(tertiarybutylamino)silane ($SiH_2(NHC(CH_3)_3)_2$ (BTBAS), bis(dimethylamino)dimethyl silane and other similar compounds where carbon substitutes on both silicon and the amino group, tert-butyl silylcarbamate, $SiH(CH_3)$—(N $(CH_3)_2)_2$, $SiHCl$—$(N(CH_3)_2)_2$, $(Si(CH_3)_2NH)_3$ and the like. A further example of an aminosilane is trisilylamine ($N(SiH_3)$). According to various embodiments, the silicon-containing reactant may or may not be UV-transparent. If a UV-transparent silicon-containing reactant is used, UV exposure will generally be timed when a nitrogen coreactant is present to be activated by the UV radiation, such as described above with respect to FIGS. 5, 6-7 and 9-13, for example.

Any suitable nitrogen-containing reactant can be used. In one embodiment, the nitrogen-containing reactant is selected from the group consisting of ammonia, a hydrazine, an amine and mixtures thereof. In some embodiments, the nitrogen-containing reactant can be activated by UV in the vapor phase. Examples include $NH_3$, $NR_3$, $NR_2H$ and $NRH_2$, $N_2$ and forming gas ($N_2/H_2$).

In one embodiment, the nitrogen-containing reactant includes a $C_{1-10}$ alkyl amine or a mixture of $C_{1-10}$ alkyl amines. In one embodiment, the $C_{1-10}$ alkyl amine is a primary alkyl amine or a secondary alkyl amine. In one embodiment, the $C_{1-10}$ alkyl amine is a primary alkyl amine. In one embodiment, the $C_{1-10}$ alkyl amine is according to formula I:

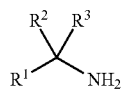

I wherein each of $R^1$, $R^2$ and $R^3$ is, independent of the others, H or $C_{1-3}$ alkyl; or two of $R^1$, $R^2$ and $R^3$, together with the carbon atom to which they are attached form a $C_{3-7}$ cycloalkyl and the other of $R^1$, $R^2$ and $R^3$ is H or $C_{1-3}$ alkyl. In one embodiment, the $C_{1-10}$ alkyl amine has a secondary or tertiary carbon attached directly to the nitrogen. In one embodiment, the $C_{1-10}$ alkyl amine is selected from the group consisting of isopropylamine, cyclopropylamine, sec-butylamine, tert-butyl amine, cyclobutylamine, isoamylamine, 2-methylbutan-2-amine and thexylamine (2,3-dimethylbutan-2-amine). In one embodiment, in the $C_{1-10}$ alkyl amine of Formula I, each of $R^1$, $R^2$ and $R^3$ is $C_{1-3}$ alkyl. In one embodiment, the $C_{1-10}$ alkyl amine is tert-butyl amine (TBA). TBA can be used.

In some embodiments, the SiN film produced has an undesirable carbon content. This in-film carbon may result in electrical leakage and may render the film unusable for some dielectric barrier applications. Carbon content can vary, but in some embodiments approximately 10% carbon (by weight) can be considered too high. Methods described herein address unwanted carbon in SiN films. Methods described herein produce SiN films with less than 2% carbon, in one embodiment less than 1% carbon, in yet another embodiment less than 0.5% carbon. In some embodiments, the reduction in carbon residue is readily observable in FTIR spectra, although other analytical methods are known to one of ordinary skill in the art that can measure carbon content in these ranges.

In some embodiments, the nitrogen-containing reactant can contain a thermally removable group. A thermally removable group is a group that breaks down into volatile components at between about 200° C. and about 550° C. For example, secondary and particularly tertiary carbon groups can undergo elimination reactions in this temperature range. In a particular example, t-butyl groups break down to form isobutylene in this temperature range. For example, t-butylamine, when heated, undergoes an elimination reaction to form isobutylene and ammonia. As another example, t-butoxycarbonyl groups (t-BOC) groups also thermally decompose, for example at about 150° C., to form isobutylene, carbon dioxide and the radical to which the t-BOC group was attached. For example, t-butylcarbamate thermally decomposes to give isobutylene ammonia and carbon dioxide.

The substrate can be heated to between about 200° C. and about 550° C. so that such groups decompose and release their carbon content and thus reduce the carbon content of the SiN film. The reactants are adsorbed onto the substrate, a plasma is used to convert the reactants to a SiN material. Remaining carbon groups can be removed by heating the substrate. The heating can be performed during the entire deposition or periodically to decompose the thermally removable groups. In one embodiment, the substrate is heated to between about 200° C. and about 550° C., in another embodiment between about 350° C. and about 550° C., in another embodiment between about 450° C. and about 550° C., and in another embodiment, between about 450° C. and about 500° C. In one embodiment, for example where TBA is used, the SiN film can be heated to between about 450° C. and about 500° C., for between about 1 second and about 30 seconds, or between about 1 second and about 20 seconds, or between about 1 second and about 10 seconds. Although any particular thermally removable group will breakdown at a certain temperature threshold, a higher temperature may be used to increase the rate of decomposition and/or as an anneal to improve the properties of the SiN film.

As described above, the thermally removable group may include a secondary or tertiary carbon functionality. Either or both of the silicon-containing reactant and the nitrogen-containing reactant can include one or more of the same or different thermally removable groups. In one embodiment, the thermally removable group is according to Formula II:

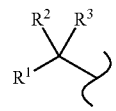

II wherein each of $R^1$, $R^2$ and $R^3$ is, independent of the others, H or $C_{1-3}$ alkyl; or two of $R^1$, $R^2$ and $R^3$, together with the carbon atom to which they are attached form a $C_{3-7}$ cycloalkyl and the other of $R^1$, $R^2$ and $R^3$ is H or $C_{1-3}$ alkyl; and where each of said thermally removable group, when part of the nitrogen-containing reactant, is attached to a nitrogen or an oxygen of the nitrogen-containing reactant, and, when part of the silicon-containing reactant, is attached to a silicon or a nitrogen or an oxygen of the silicon-containing reactant. In one embodiment, each of $R^1$, $R^2$ and $R^3$ is, independent of the others, $C_{1-3}$ alkyl. In one embodiment, the thermally removable group is a t-butyl group.

Apparatus

Another aspect of the invention is an apparatus configured to accomplish the methods described herein. A suitable apparatus includes hardware for accomplishing the process operations and a system controller having instructions for controlling process operations in accordance with the present invention.

Figure 14:
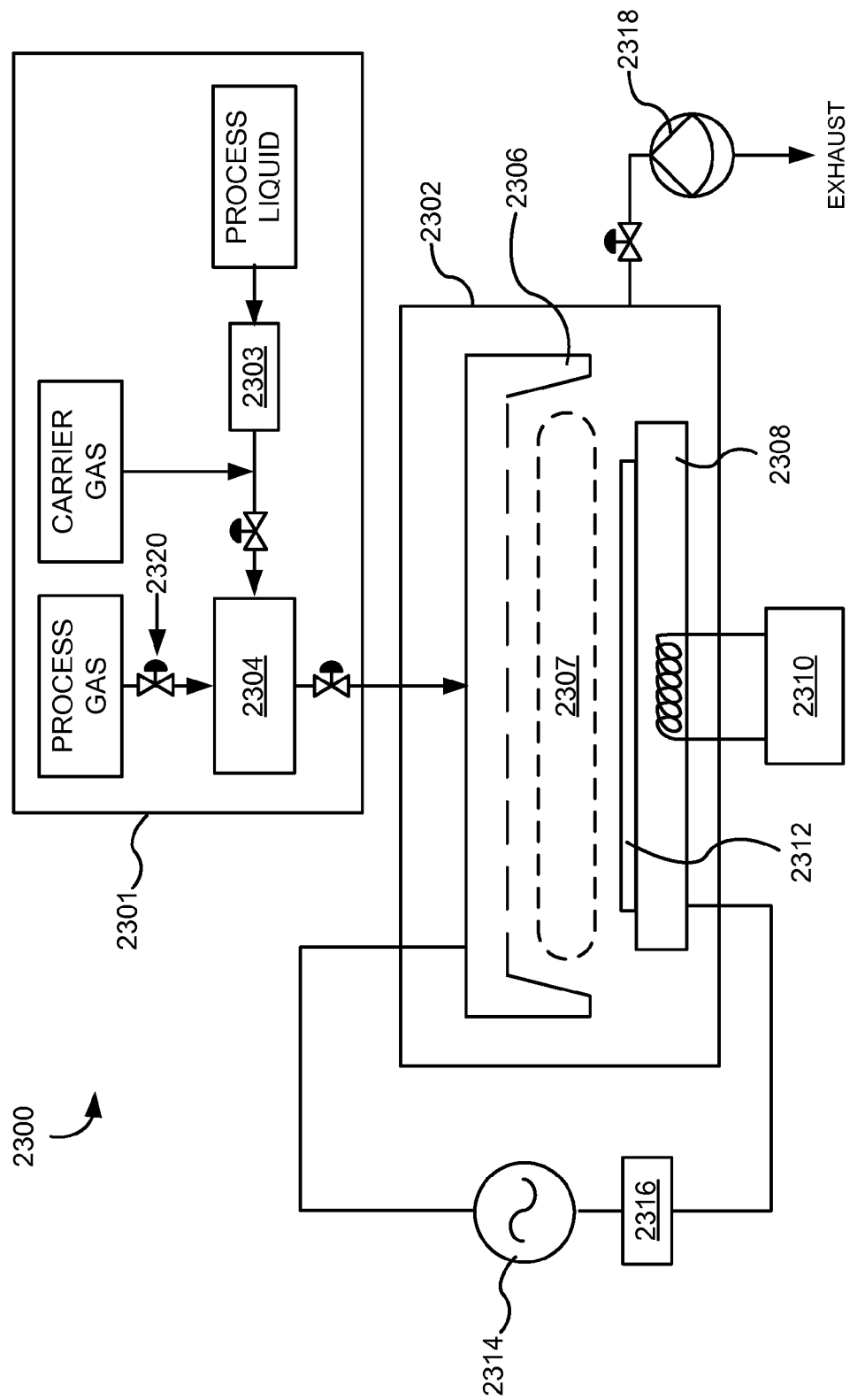
FIG. 14 depicts an example of a CFD process SiN, SiCN, SiCg station.
Figure 15:
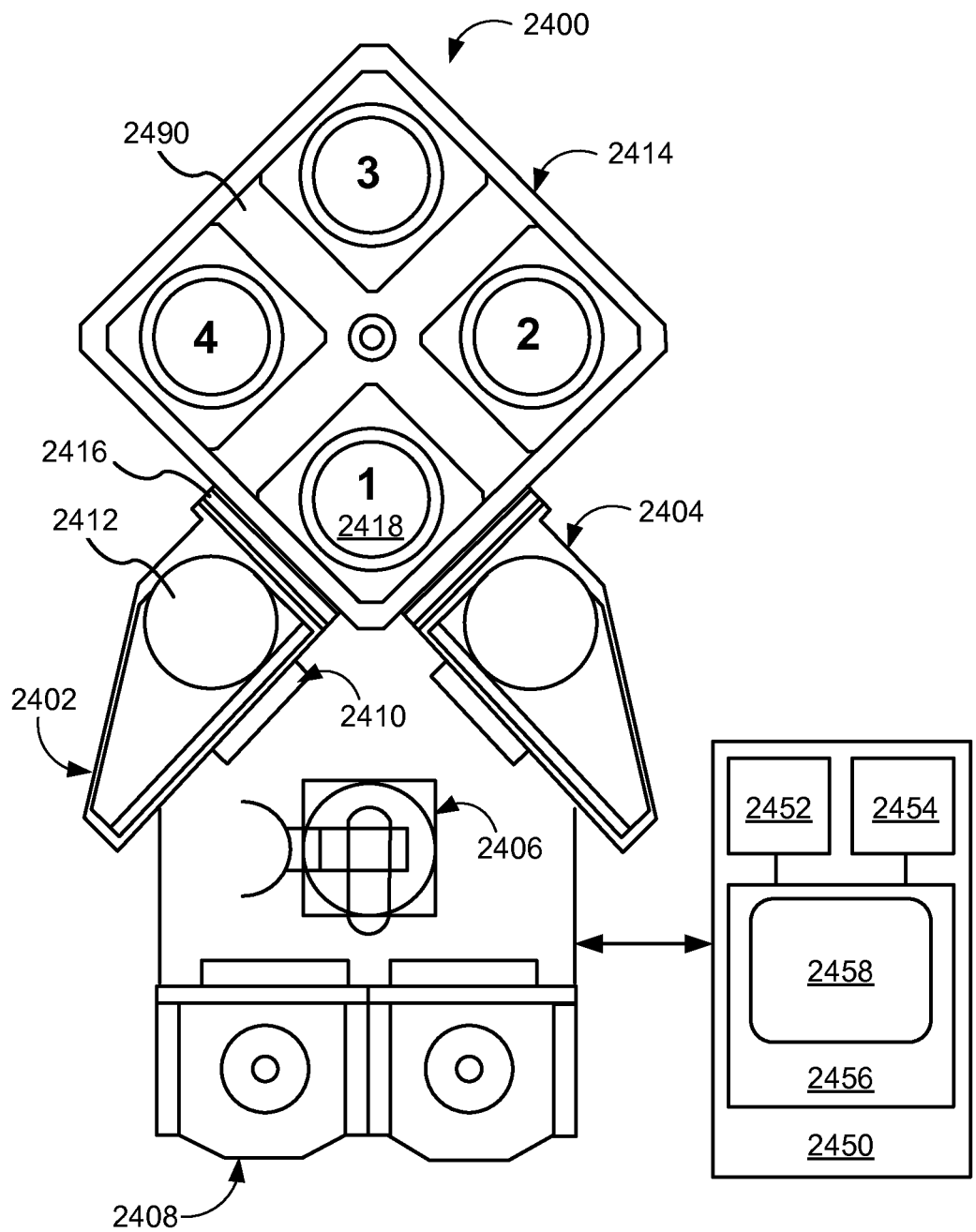
FIG. 15 depicts an example of a schematic view of a multi-station processing tool.

It will be appreciated that any suitable process station may be employed with one or more of the embodiments described above. For example, FIG. 14 schematically shows a CFD process station 2300. For simplicity, CFD process station 2300 is depicted as a standalone process station having a process chamber body 2302 for maintaining a low-pressure environment. However, it will be appreciated that a plurality of CFD process stations 2300 may be included in a common low-pressure process tool environment. While the embodiment depicted in FIG. 14 shows one process station, it will be appreciated that, in some embodiments, a plurality of process stations may be included in a processing tool. For example, FIG. 15 depicts an embodiment of a multi-station processing tool 2400. Further, it will be appreciated that, in some embodiments, one or more hardware parameters of CFD process station 2300, including those discussed in detail below, may be adjusted programmatically by one or more computer controllers.

A CFD process station 2300 fluidly communicates with reactant delivery system 2301 for delivering process gases to a distribution showerhead 2306. Reactant delivery system 2301 includes a mixing vessel 2304 for blending and/or conditioning process gases for delivery to showerhead 2306. One or more mixing vessel inlet valves 2320 may control introduction of process gases to mixing vessel 2304.

Some reactants may be stored in liquid form prior to vaporization at and subsequent delivery to the process station. For example, the apparatus of FIG. 14 includes a vaporization point 2303 for vaporizing liquid reactant to be supplied to mixing vessel 2304. In some embodiments, vaporization point 2303 may be a heated vaporizer. The saturated reactant vapor produced from such vaporizers may condense in downstream delivery piping. Exposure of incompatible gases to the condensed reactant may create small particles. These small particles may clog piping, impede valve operation, contaminate substrates, etc. Some approaches to addressing these issues involve sweeping and/or evacuating the delivery piping to remove residual reactant. However, sweeping the delivery piping may increase process station cycle time, degrading process station throughput. Thus, in some embodiments, delivery piping downstream of vaporization point 2303 is heat traced. In some examples, mixing vessel 2304 is also heat traced. In one non-limiting example, piping downstream of vaporization point 2303 has an increasing temperature profile extending from approximately 100° C. to approximately 150° C. at mixing vessel 2304.

In some embodiments, reactant liquid is vaporized at a liquid injector. For example, a liquid injector may inject pulses of a liquid reactant into a carrier gas stream upstream of the mixing vessel. In one embodiment, a liquid injector vaporizes reactant by flashing the liquid from a higher pressure to a lower pressure. In another embodiment, a liquid injector atomizes the liquid into dispersed microdroplets that are subsequently vaporized in a heated delivery pipe. It will be appreciated that smaller droplets may vaporize faster than larger droplets, reducing a delay between liquid injection and complete vaporization. Faster vaporization may reduce a length of piping downstream from vaporization point 2303. In one embodiment, a liquid injector is mounted directly to mixing vessel 2304. In another embodiment, a liquid injector is mounted directly to showerhead 2306.

In some embodiments, a liquid flow controller upstream of vaporization point 2303 is provided for controlling a mass flow of liquid for vaporization and delivery to process station 1300. In one example, the liquid flow controller (LFC) includes a thermal mass flow meter (MFM) located downstream of the LFC. A plunger valve of the LFC is adjusted responsive to feedback control signals provided by a proportional-integral-derivative (PID) controller in electrical communication with the MFM. However, it may take one second or more to stabilize liquid flow using feedback control. This may extend a time for dosing a liquid reactant. Thus, in some embodiments, the LFC is dynamically switched between a feedback control mode and a direct control mode. In some embodiments, the LFC is dynamically switched from a feedback control mode to a direct control mode by disabling a sense tube of the LFC and the PID controller.

Showerhead 2306 distributes process gases toward substrate 2312. In the embodiment shown in FIG. 14, substrate 2312 is located beneath showerhead 2306, and is shown resting on a pedestal 1308. It will be appreciated that showerhead 2306 may have any suitable shape, and may have any suitable number and arrangement of ports for distributing processes gases to substrate 2312.

In some embodiments, a microvolume 2307 is located beneath showerhead 2306. Performing a CFD process in a microvolume rather than in the entire volume of a process station may reduce reactant exposure and sweep times, may reduce times for altering CFD process conditions (e.g., pressure, temperature, etc.), may limit an exposure of process station robotics to process gases, etc. Example microvolume sizes include, but are not limited to, volumes between 0.1 liter and 2 liters.

In some embodiments, pedestal 2308 may be raised or lowered to expose substrate 2312 to microvolume 2307 and/or to vary a volume of microvolume 2307. For example, in a substrate transfer phase, pedestal 2308 is lowered to allow substrate 2312 to be loaded onto pedestal 2308. During a CFD process phase, pedestal 2308 is raised to position substrate 2312 within microvolume 2307. In some embodiments, microvolume 2307 completely encloses substrate 2312 as well as a portion of pedestal 2308 to create a region of high flow impedance during a CFD process.

Optionally, pedestal 2308 may be lowered and/or raised during portions the CFD process to modulate process pressure, reactant concentration, etc., within microvolume 2307. In one embodiment where process chamber body 2302 remains at a base pressure during the CFD process, lowering pedestal 2308 allows microvolume 2307 to be evacuated. Example ratios of microvolume to process chamber volume include, but are not limited to, volume ratios between 1:500 and 1:10. It will be appreciated that, in some embodiments, pedestal height may be adjusted programmatically by a suitable computer controller.

In another embodiment, adjusting a height of pedestal 2308 allows a plasma density to be varied during plasma activation and/or treatment cycles included in the CFD process. At the conclusion of the CFD process phase, pedestal 2308 is lowered during another substrate transfer phase to allow removal of substrate 2312 from pedestal 2308.

While the example microvolume variations described herein refer to a height-adjustable pedestal, it will be appreciated that, in some embodiments, a position of showerhead 2306 may be adjusted relative to pedestal 2308 to vary a volume of microvolume 2307. Further, it will be appreciated that a vertical position of pedestal 2308 and/or showerhead 2306 may be varied by any suitable mechanism. One of ordinary skill in the art would appreciate that such mechanism would include, for example, hydraulics, pneumatics, spring mechanisms, solenoids and the like. In some embodiments, pedestal 2308 may include a rotational mechanism, for example along an axis perpendicular to the surface of the substrate, for rotating an orientation of substrate 2312. It will be appreciated that, in some embodiments, one or more of these example adjustments may be performed programmatically by one or more suitable computer controllers.

Returning to the embodiment shown in FIG. 14, showerhead 2306 and pedestal 1308 electrically communicate with RF power supply 2314 and matching network 2316 for powering a plasma. In some embodiments, the plasma energy is controlled by controlling one or more of a process station pressure, a gas concentration, an RF source power, an RF source frequency, and a plasma power pulse timing. For example, RF power supply 2314 and matching network 2316 may be operated at any suitable power to form a plasma having a desired composition of radical species. Examples of suitable powers include, but are not limited to, powers between 100 W and 5000 W. Likewise, RF power supply 2314 may provide RF power of any suitable frequency. In some embodiments, RF power supply 2314 may be configured to control high- and low-frequency RF power sources independently of one another. Example low-frequency RF frequencies may include, but are not limited to, frequencies between 50 kHz and 500 kHz. Example high-frequency RF frequencies may include, but are not limited to, frequencies between 1.8 MHz and 2.45 GHz. It will be appreciated that any suitable parameters may be modulated discretely or continuously to provide plasma energy for the surface reactions. In one non-limiting example, the plasma power may be intermittently pulsed to reduce ion bombardment with the substrate surface relative to continuously powered plasmas.

In some embodiments, the plasma is monitored in-situ by one or more plasma monitors. In one embodiment, plasma power is monitored by one or more voltage, current sensors (e.g., VI probes). In another embodiment, plasma density and/or process gas concentration is measured by one or more optical emission spectroscopy sensors (OES). In some embodiments, one or more plasma parameters are programmatically adjusted based on measurements from such in-situ plasma monitors. For example, an OES sensor may be used in a feedback loop for providing programmatic control of plasma power. It will be appreciated that, in some embodiments, other monitors may be used to monitor the plasma and other process characteristics. Such monitors include, but are not limited to, infrared (IR) monitors, acoustic monitors, and pressure transducers.

In some embodiments, the plasma is controlled via input/output control (IOC) sequencing instructions. For example, the instructions for setting plasma conditions for a plasma process phase may be included in a corresponding plasma activation recipe phase of a CFD process recipe. In some embodiments, process recipe phases may be sequentially arranged, so that all instructions for a CFD process phase are executed concurrently with that process phase. It will be appreciated that some aspects of plasma generation may have well-characterized transient and/or stabilization times that may prolong a plasma process phase. Put another way, such time delays may be predictable. Such time delays may include a time to strike the plasma and a time to stabilize the plasma at the indicted power setting.

In some embodiments, pedestal 2308 may be temperature controlled via heater 2310. Further, in some embodiments, pressure control for CFD process station 2300 may be provided by butterfly valve 2318. As shown in FIG. 14, butterfly valve 2318 throttles a vacuum provided by a downstream vacuum pump (not shown). However, in some embodiments, pressure control of process station 2300 may also be adjusted by varying a flow rate of one or more gases introduced to CFD process station 2300.

As described above, one or more process stations may be included in a multi-station processing tool. FIG. 15 shows a schematic view of a multi-station processing tool, 2400, with an inbound load lock 2402 and an outbound load lock 2404, either or both of which may comprise a remote plasma source. A robot 2406, at atmospheric pressure, is configured to move wafers from a cassette loaded through a pod 2408 into inbound load lock 2402 via an atmospheric port 2410. A wafer is placed by the robot 2406 on a pedestal 2412 in the inbound load lock 2402, the atmospheric port 2410 is closed, and the load lock is pumped down. Where the inbound load lock 2402 comprises a remote plasma source, the wafer may be exposed to a remote plasma treatment in the load lock prior to being introduced into a processing chamber 2414. Further, the wafer also may be heated in the inbound load lock 2402 as well, for example, to remove moisture and adsorbed gases. Next, a chamber transport port 2416 to processing chamber 2414 is opened, and another robot (not shown) places the wafer into the reactor on a pedestal of a first station shown in the reactor for processing. While the embodiment depicted in FIG. 15 includes load locks, it will be appreciated that, in some embodiments, direct entry of a wafer into a process station may be provided.

The depicted processing chamber 2414 comprises four process stations, numbered from 1 to 4 in the embodiment shown in FIG. 15. Each station has a heated pedestal (shown at 2418 for station 1), and gas line inlets. It will be appreciated that in some embodiments, each process station may have different or multiple purposes. For example, in some embodiments, a process station may be switchable between a CFD and PECVD process mode. Additionally or alternatively, in some embodiments, processing chamber 2414 may include one or more matched pairs of CFD and PECVD process stations. Still further, in some embodiments, processing chamber 2414 may include one or more UV cure stations or remote plasma treatment stations. While the depicted processing chamber 2414 comprises four stations, it will be understood that a processing chamber according to the present disclosure may have any suitable number of stations. For example, in some embodiments, a processing chamber may have five or more stations, while in other embodiments a processing chamber may have three or fewer stations.

FIG. 15 also depicts a wafer handling system 2490 for transferring wafers within processing chamber 2414. In some embodiments, wafer handling system 2490 may transfer wafers between various process stations and/or between a process station and a load lock. It will be appreciated that any suitable wafer handling system may be employed. Non-limiting examples include wafer carousels and wafer handling robots. FIG. 15 also depicts a system controller 2450 employed to control process conditions and hardware states of process tool 2400. System controller 2450 may include one or more memory devices 2456, one or more mass storage devices 2454, and one or more processors 2452. Processor 2452 may include a CPU or computer, analog and/or digital input/output connections, stepper motor controller boards, etc.

In some embodiments, system controller 2450 controls all of the activities of process tool 2400. System controller 2450 executes system control software 2458 stored in mass storage device 2454, loaded into memory device 2456, and executed on processor 2452. System control software 2458 may include instructions for controlling the timing, mixture of gases, chamber and/or station pressure, chamber and/or station temperature, wafer temperature, target power levels, RF power levels, substrate pedestal, chuck and/or susceptor position, and other parameters of a particular process performed by process tool 2400. System control software 2458 may be configured in any suitable way. For example, various process tool component subroutines or control objects may be written to control operation of the process tool components necessary to carry out various process tool processes. System control software 2458 may be coded in any suitable computer readable programming language.

In some embodiments, system control software 2458 may include input/output control (IOC) sequencing instructions for controlling the various parameters described above. For example, each phase of a CFD process may include one or more instructions for execution by system controller 2450. The instructions for setting process conditions for a CFD process phase may be included in a corresponding CFD recipe phase. In some embodiments, the CFD recipe phases may be sequentially arranged, so that all instructions for a CFD process phase are executed concurrently with that process phase.

Other computer software and/or programs stored on mass storage device 2454 and/or memory device 2456 associated with system controller 2450 may be employed in some embodiments. Examples of programs or sections of programs for this purpose include a substrate positioning program, a process gas control program, a pressure control program, a heater control program, and a plasma control program.

A substrate positioning program may include program code for process tool components that are used to load the substrate onto pedestal 2418 and to control the spacing between the substrate and other parts of process tool 2400.

A process gas control program may include code for controlling gas composition and flow rates and optionally for flowing gas into one or more process stations prior to deposition in order to stabilize the pressure in the process station. A pressure control program may include code for controlling the pressure in the process station by regulating, for example, a throttle valve in the exhaust system of the process station, a gas flow into the process station, etc.

A heater control program may include code for controlling the current to a heating unit that is used to heat the substrate. Alternatively, the heater control program may control delivery of a heat transfer gas (such as helium) to the substrate.

A plasma control program may include code for setting RF power levels applied to the process electrodes in one or more process stations.

In some embodiments, there may be a user interface associated with system controller 2450. The user interface may include a display screen, graphical software displays of the apparatus and/or process conditions, and user input devices such as pointing devices, keyboards, touch screens, microphones, etc.

In some embodiments, parameters adjusted by system controller 2450 may relate to process conditions. Non-limiting examples include process gas composition and flow rates, temperature, pressure, plasma conditions (such as RF bias power levels), pressure, temperature, etc. These parameters may be provided to the user in the form of a recipe, which may be entered utilizing the user interface.

Signals for monitoring the process may be provided by analog and/or digital input connections of system controller 2450 from various process tool sensors. The signals for controlling the process may be output on the analog and digital output connections of process tool 2400. Non-limiting examples of process tool sensors that may be monitored include mass flow controllers, pressure sensors (such as manometers), thermocouples, etc. Appropriately programmed feedback and control algorithms may be used with data from these sensors to maintain process conditions.

System controller 2450 may provide program instructions for implementing the above-described deposition processes. The program instructions may control a variety of process parameters, such as DC power level, RF bias power level, pressure, temperature, etc. The instructions may control the parameters to operate in-situ deposition of film stacks according to various embodiments described herein.

The system controller will typically include one or more memory devices and one or more processors configured to execute the instructions so that the apparatus will perform a method in accordance with the present invention. Machine-readable media containing instructions for controlling process operations in accordance with the present invention may be coupled to the system controller.

EXAMPLES

Bis(dimethylamono)dimethyl silane and an N-reactant were reacted to form Si-containing films by UV and remote plasma-assisted methods according to embodiments described herein. A UV cure apparatus with four stations each including a UV lamp was used. The process sequences were as follows:

UV ALD: Bis(dimethylamono)dimethyl silane exposure on Stations 1 & 3 (UV lamps OFF), UV with NH3 exposure on Stations 2 & 4. Sequence: Bis(dimethylamono)dimethyl silane exposure→purge→purge→index to next station→UV in NH3→purge→index to next station. Typical bis(dimethylamono)dimethyl exposure time was 20 s, with 2 mL/min of flow with 1 slm carrier (Ar) on Stations 1 & 3. The wafer was allowed to soak for 60 s in Stations 1 & 3. The film contained SiN with C likely to be present based on width of the SiNC peak. Significant amounts of both N—H and Si—H were present.

Remote plasma ALD: Bis(dimethylamono)dimethyl silane exposure on Stations 3 & 4, remote plasma with NH3 (+Ar) exposure on Stations 1 & 2. UV lamps off on all stations. 1 slm $NH_3$/5 slm Ar used to generate $NH_x$ radicals remotely using an Astron (20 s exposure). Sequence: Bis(dimethylamono)dimethyl silane exposure exposure→Purge→index 2 stations→remote plasma $NH_3$→Purge→index 2 stations. The wafer was allowed to soak in stations 3 & 4 for 60 s. The film was primarily a SiN film, with the possible carbon content. No Si—H bonds were present. Reducing RP time to 5 s (from 20 s) had no impact on film thickness or film quality.

Patterning Method/Apparatus:

The apparatus/process described herein may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically comprises some or all of the following steps, each step enabled with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper. In one embodiment, a SiN film is formed using a method as described herein. The SiN film is used, for example, for one of the purposes described herein. Further, the method includes one or more steps (1)-(6) described above.

The invention claimed is:
1. A method comprising:
providing a substrate to a reaction chamber; and performing one or more deposition cycles to deposit a silicon-containing film, each cycle comprising:
(a) exposing the substrate to a vapor phase flow of a nitrogen-containing reactant;

(b) exposing the substrate to a vapor phase flow of a silicon-containing reactant; and (c) exposing the vapor phase flow of the nitrogen-containing reactant, but not the vapor phase flow of the silicon-containing reactant, to ultraviolet radiation.

2. The method of claim 1, wherein the substrate is exposed to the vapor phase flow of the nitrogen-containing reactant during exposure to the vapor phase flow of the silicon-containing precursor.

3. The method of claim 1, wherein the substrate is not exposed to the vapor phase flow of the nitrogen-containing reactant during exposure to the vapor phase of the silicon-containing precursor.

4. The method of claim 1, wherein the vapor phase flow of the nitrogen-containing reactant is exposed to ultraviolet radiation in the reaction chamber.

5. The method of claim 1, wherein the vapor phase flow of the nitrogen-containing reactant is exposed to ultraviolet radiation upstream of the chamber.

6. The method of claim 1, wherein the silicon-containing reactant is selected from the group consisting of a silane, a halosilane, and an aminosilane, and mixtures thereof.

7. The method of claim 1, wherein the silicon-containing reactant is an aminosilane including carbon-containing substituents on a Si and on an amino group.

8. The method of claim 1, wherein the nitrogen-containing reactant is selected from the group consisting of ammonia, a hydrazine, an amine, and mixtures thereof.

9. The method of claim 1, wherein the silicon-containing film is selected from the group consisting of SiN, SiCN, SiON or SiONC.

10. The method of claim 1, wherein the silicon-containing film is SiCN.

11. A method comprising:
providing a substrate to a reaction chamber; and performing one or more deposition cycles to deposit a silicon-containing film, each cycle comprising:
(a) activating a vapor phase flow of a nitrogen-containing reactant with a remote plasma source;
(b) exposing the substrate to the activated nitrogen-containing reactant; and
(c) exposing the substrate to a vapor phase flow of a silicon-containing reactant.

12. The method of claim 11, wherein the substrate is exposed to the vapor phase flow of the nitrogen-containing reactant during exposure to the vapor phase flow of the silicon-containing precursor.

13. The method of claim 11, wherein the substrate is not exposed to the vapor phase flow of the nitrogen-containing reactant during exposure to the vapor phase of the silicon-containing precursor.

14. The method of claim 11, wherein the silicon-containing reactant is selected from the group consisting of a silane, a halosilane, and an aminosilane, and mixtures thereof.

15. The method of claim 1, wherein the silicon-containing reactant is an aminosilane including carbon-containing substituents on a Si and on an amino group.

16. The method of claim 1, wherein the nitrogen-containing reactant is selected from the group consisting of ammonia, a hydrazine, an amine, and mixtures thereof.

17. The method of claim 1, wherein the silicon-containing film is selected from the group consisting of SiN, SiCN, SiON or SiONC.

18. The method of claim 1, wherein the silicon-containing film is SiCN.

* * * * *